(12) United States Patent
Lee et al.

(10) Patent No.: US 11,340,790 B2
(45) Date of Patent: May 24, 2022

(54) STORAGE DEVICE FOR MIGRATING DATA BASED ON RANDOM READ WORKLOAD AND OPERATING METHOD OF THE SAME

(71) Applicant: SK hynix Inc., Gyeonggi-do (KR)

(72) Inventors: Joo Young Lee, Seoul (KR); Kyeong Rho Kim, Gyeonggi-do (KR); Kyung Hoon Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 11 days.

(21) Appl. No.: 16/656,215

(22) Filed: Oct. 17, 2019

(65) Prior Publication Data
US 2020/0050362 A1    Feb. 13, 2020

Related U.S. Application Data

(63) Continuation of application No. 15/832,966, filed on Dec. 6, 2017, now Pat. No. 10,466,905.

(30) Foreign Application Priority Data

Jul. 7, 2017    (KR) .......................... 10-2017-0086690

(51) Int. Cl.
*G06F 3/06* (2006.01)
*G06F 12/02* (2006.01)
(Continued)

(52) U.S. Cl.
CPC .............. *G06F 3/061* (2013.01); *G06F 3/064* (2013.01); *G06F 3/065* (2013.01); *G06F 3/0659* (2013.01);
(Continued)

(58) Field of Classification Search
CPC .......... G06F 3/061; G06F 3/064; G06F 3/065; G06F 3/0659; G06F 3/0679; G06F 3/0647
See application file for complete search history.

(56) References Cited

U.S. PATENT DOCUMENTS

| | | | |
|---|---|---|---|
| 2009/0177817 A1* | 7/2009 | Hung | G06F 3/0604 710/72 |
| 2012/0330927 A1 | 12/2012 | Musial et al. | |

(Continued)

FOREIGN PATENT DOCUMENTS

| | | |
|---|---|---|
| CN | 103026346 A | 4/2013 |
| CN | 103092697 A | 5/2013 |

(Continued)

OTHER PUBLICATIONS

Notice of Allowance issued by the Chinese Patent Office dated Jul. 8, 2021.

(Continued)

*Primary Examiner* — Charles Rones
*Assistant Examiner* — Hewy H Li
(74) *Attorney, Agent, or Firm* — IP & T Group LLP

(57) ABSTRACT

Provided herein may be a storage device and a method of operating the same. A memory controller for controlling a memory device including a plurality of memory blocks having improved read performance may include a random read workload control unit configured to control a state of a random read workload such that the random read workload is in any one of a set state and a clear state depending on a random read count obtained by counting a number of random read requests that are inputted from an external host; and a random read processing unit configured to retrieve a physical address corresponding to a logical address of the respective random read requests depending on the state of the random read workload.

17 Claims, 13 Drawing Sheets

(51) Int. Cl.
*G06F 12/0868* (2016.01)
*G06F 12/1009* (2016.01)
*G06F 12/0891* (2016.01)
*G11C 16/04* (2006.01)

(52) U.S. Cl.
CPC ........ *G06F 3/0679* (2013.01); *G06F 12/0238* (2013.01); *G06F 12/0868* (2013.01); *G06F 12/0891* (2013.01); *G06F 12/1009* (2013.01); *G06F 2212/2146* (2013.01); *G06F 2212/313* (2013.01); *G06F 2212/6042* (2013.01); *G06F 2212/7201* (2013.01); *G11C 16/0483* (2013.01)

(56) References Cited

U.S. PATENT DOCUMENTS

| | | | | |
|---|---|---|---|---|
| 2013/0262813 A1* | 10/2013 | Muroyama | ............. | G06F 3/061 711/171 |
| 2014/0156964 A1* | 6/2014 | Choi | ................... | G06F 12/0646 711/171 |
| 2015/0347040 A1* | 12/2015 | Mathur | ................. | G06F 3/0679 711/103 |
| 2017/0123682 A1* | 5/2017 | Sinclair | ................. | G06F 3/0611 |
| 2017/0315925 A1* | 11/2017 | Yeh | ..................... | G06F 12/1009 |
| 2019/0004700 A1* | 1/2019 | Oshinsky | .............. | G06F 3/0688 |
| 2021/0073134 A1* | 3/2021 | Allu | .................... | G06F 12/0848 |

FOREIGN PATENT DOCUMENTS

| | | |
|---|---|---|
| CN | 104077084 A | 10/2014 |
| CN | 106575271 A | 4/2017 |
| CN | 106909476 A | 6/2017 |
| KR | 10-2014-0072639 A | 6/2014 |

OTHER PUBLICATIONS

Notice of Allowance issued by the Korean Patent Office dated Aug. 30, 2021.

\* cited by examiner

STORAGE DEVICE FOR MIGRATING DATA BASED ON RANDOM READ WORKLOAD AND OPERATING METHOD OF THE SAME

CROSS-REFERENCE TO RELATED APPLICATION

This application is a continuation of U.S. patent application Ser. No. 15/832,966 filed on Dec. 6, 2017, which claims benefits of priority of Korean Patent Application No. 10-2017-0086690 filed on Jul. 7, 2017. The disclosure of each of the foregoing application is incorporated herein by reference in its entirety.

BACKGROUND

Field of Invention

Various embodiments of the present disclosure generally relate to an electronic device. Particularly, exemplary embodiments of the present disclosure relate to a storage device and a method of operating the storage device.

Description of Related Art

A storage device is a device for storing data under the control of a host device, such as a computer, a smart phone, or a smart pad. Examples of the storage device include a device for storing data in a magnetic disk, as in the case of a hard disk drive (HDD), and a device for storing data in a semiconductor memory, especially in a nonvolatile memory, as in the case of a solid state drive (SSD) or a memory card.

Representative examples of the nonvolatile memory include a read-only memory (ROM), a programmable ROM (PROM), an electrically programmable ROM (EPROM), an electrically erasable and programmable ROM (EEPROM), a flash memory, a phase-change random access memory (PRAM), a magnetic RAM (MRAM), a resistive RAM (RRAM), a ferroelectric RAM (FRAM), etc.

SUMMARY

Various embodiments of the present disclosure are directed to a storage device having improved read performance and a method of operating the storage device.

An embodiment of the present disclosure may provide for a memory controller for controlling a memory device including a plurality of memory blocks. The memory controller may include a random read workload control unit configured to control a state of a random read workload such that the random read workload is in any one of a set state and a clear state depending on a random read count obtained by counting a number of random read requests that are inputted from an external host; and a random read processing unit configured to retrieve a physical address corresponding to a logical address of the respective random read requests depending on the state of the random read workload.

An embodiment of the present disclosure may provide for a method of operating a memory controller for controlling a memory device Including a plurality of memory blocks. The method may include generating a random read count by counting a number of random read generating a random read count by counting a number of random read requests that are successively inputted from an external host; controlling a state of a random read workload such that the random read workload is in any one of a set state and a clear state depending on the random read count; and retrieving a physical address corresponding to a logical address of the respective random read requests depending on the state of the random read workload.

An embodiment of the present disclosure may provide for a storage device. The storage device may include a memory device including a plurality of memory blocks; and a memory controller configured to retrieve a physical address corresponding to a logical address of a random read request depending on a random read count obtained by counting a number of random read requests that are successively inputted from an external host.

DETAILED DESCRIPTION

Figure 1:
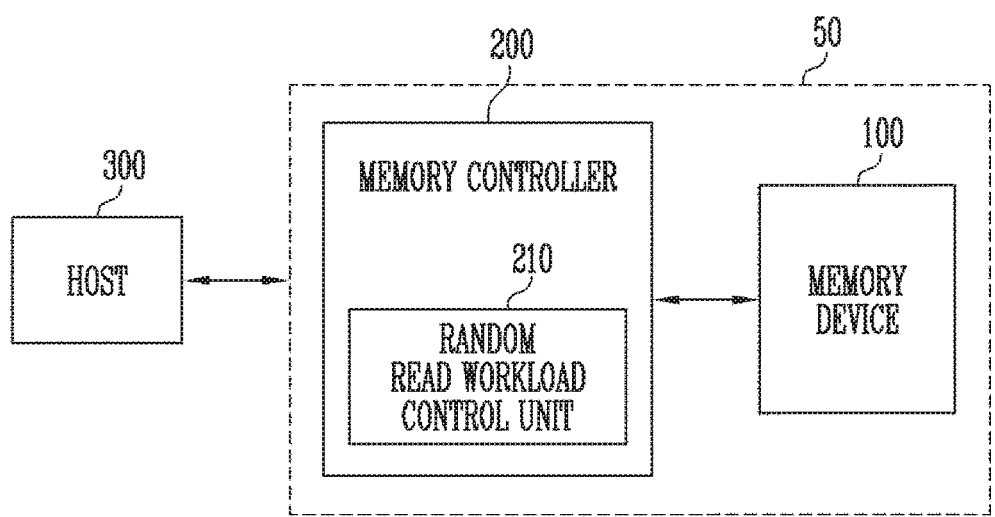
FIG. 1 is a diagram illustrating a storage device according to an embodiment of the present disclosure.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present.

Hereinafter, embodiments will be described with reference to the accompanying drawings. Embodiments are described herein with reference to cross-sectional illustrations that are schematic illustrations of embodiments (and intermediate structures). As such, variations from the shapes of the illustrations as a result, for example, of manufacturing techniques and/or tolerances, may be present. Thus, embodiments should not be construed as limited to the particular shapes of regions illustrated herein but may include deviations in shapes that result, for example, from manufacturing. In the drawings, lengths and sizes of layers and regions may be exaggerated for clarity. Like reference numerals in the drawings denote like elements.

Terms such as "first" and "second" may be used to describe various components, but they should not limit the various components. Those terms are only used for the purpose of differentiating a component from other components. For example, a first component may be referred to as a second component, and a second component may be referred to as a first component and so forth without departing from the spirit and scope of the present disclosure. Furthermore, "and/or" may include any one of or a combination of the components mentioned.

Furthermore, a singular form may include a plural from as long as it is not specifically mentioned in a sentence. Furthermore, "include/comprise" or "including/comprising" used in the specification represents that one or more components, steps, operations, and elements exist or are added.

Furthermore, unless defined otherwise, all the terms used in this specification including technical and scientific terms have the same meanings as would be generally understood by those skilled in the related art. The terms defined in generally used dictionaries should be construed as having the same meanings as would be construed in the context of the related art, and unless clearly defined otherwise in this specification, should not be construed as having idealistic or overly formal meanings.

It is also noted that in this specification, "connected/coupled" refers to one component not only directly coupling another component but also Indirectly coupling another component through an intermediate component. On the other hand, "directly connected/directly coupled" refers to one component directly coupling another component without an intermediate component.

FIG. 1 is a diagram illustrating a storage device according to an embodiment of the present disclosure.

Referring to FIG. 1, a storage device 50 may include a memory device 100 and a memory controller 200.

The memory device 100 may store data. The memory device 100 is operated under the control of the memory controller 200. The memory device 100 may include a memory cell array including a plurality of memory cells in which data is stored. The memory cell array may include a plurality of memory blocks. Each memory block may Include a plurality of memory cells. The memory device 100 may store data in the memory blocks either sequentially or randomly under the control of the memory controller 200. In an embodiment, examples of the memory device 100 may include a Double Data Rate Synchronous Dynamic Random Access Memory (DDR SDRAM), a Low Power Double Data Rate4 (LPDDR4) SDRAM, a Graphics Double Data Rate (GDDR) SDRAM, a Low Power DDR (LPDDR) SDRAM, a Rambus Dynamic Random Access Memory (RDRAM), a NAND flash memory, a vertical NAND flash memory, a NOR flash memory device, a resistive random access memory (RRAM), a phase-change memory (PRAM), a magnetoresistive random access memory (MRAM), a ferroelectric random access memory (FRAM), or a spin transfer torque random access memory (STT-RAM). In an embodiment, the memory device 100 may be implemented as a three-dimensional (3D) array structure. The present disclosure may also be applied not only to a flash memory in which a charge storage layer is implemented as a conductive floating gate (FG), but also to a charge trap flash (CTF) memory in which a charge storage layer is implemented as an insulating layer.

The memory device 100 may receive a command and an address from the memory controller 200, and access a region, selected in response to the address, in the memory cell array. That is, the memory device 100 may perform an operation corresponding to the command on the region selected in response to the address. For example, the memory device 100 may perform a program operation, a read operation, and an erase operation. During a program operation, the memory device 100 may program data in the region selected in response to the address. During a read operation, the memory device 100 may read data from the region selected in response to the address. During an erase operation, the memory device 100 may erase data stored in the region selected in response to the address.

The memory controller 200 may control the operation of the memory device 100 in response to a request from a host 300. In another embodiment, the memory controller 200 may control the operation of the memory device 100 autonomously.

For example, the memory controller 200 may control the memory device 100 so that a program operation, a read operation or an erase operation is performed in response to the request from the host 300. During a program operation, the memory controller 200 may provide a program command, a physical address, and data to the memory device 100. During a read operation, the memory controller 200 may provide a read command and a physical address to the memory device 100. During an erase operation, the memory controller 200 may provide an erase command and a physical address to the memory device 100.

In another example, the memory controller 200 may autonomously generate a program command, an address, and data without receiving a request from the host 300, and transmit them to the memory device 100. For example, the memory controller 200 may provide commands, addresses, and data to the memory device 100 to perform background operations, such as a program operation for wear leveling and a program operation for garbage collection.

The memory controller 200 may run firmware (FW) for controlling the memory device 100. When the memory device 100 is a flash memory device, the memory controller 200 may operate firmware such as a Flash Translation Layer (FTL) for controlling communication between the host 300 and the memory device 100.

In detail, the memory controller 200 may translate a logical address included in a request from the host 300 into a physical address.

When a write request is received from the host 300, the memory controller 200 may temporarily store write data included in the request from the host 300 in a write cache buffer (not illustrated). When a preset condition is satisfied, the memory controller 200 stores the data, temporarily stored in the write cache buffer, in the memory device 100.

In order to store data in the memory device 100, the memory controller 200 may allocate the physical address of the memory device 100 to the logical address included in the request from the host 300. The memory controller 200 may store corresponding relations between logical addresses and physical addresses allocated to the logical addresses in the form of a mapping table. In an embodiment, the mapping table in which corresponding relations between logical addresses and physical addresses corresponding to the data stored in the memory device 100 are stored may be either a Logical address to Physical address (i.e., Logical to Physical: L2P) mapping table or a Physical address to Logical address (i.e., Physical to Logical: P2L) mapping table.

The plurality of memory blocks included in the memory device 100 may be divided into open blocks in which an available data storage space remains, writing-completed blocks (closed blocks) in which an available data storage space does not remain, that is, the writing of data has been completed, and free blocks in which no data is stored.

The L2P mapping table may be a mapping table for writing-completed blocks (closed blocks). That is, the L2P mapping table may represent the physical addresses and corresponding logical addresses of pieces of data stored in the writing-completed blocks (closed blocks) included in the memory device 100.

The P2L mapping table may be a mapping table for open blocks. That is, the P2L mapping table may represent logical addresses and corresponding physical addresses of pieces of data stored in open blocks included in the memory device 100. In an embodiment, when an open block becomes full of data as a result of a write operation or when the allocation of logical addresses to the physical addresses included in the P2L mapping table has been completed, the memory controller 200 may update the L2P mapping table based on the P2L mapping table.

When a read request is received from the host 300, the memory controller 200 may retrieve a physical address of the memory device 100 corresponding to a logical address provided along with the request from the host 300. For this operation, the memory controller 200 may retrieve the physical address corresponding to the logical address provided along with the request from the host 300 by searching at least one of the write cache buffer, the L2P mapping table, and the P2L mapping table. The memory controller 200 may transmit a read command and the retrieved physical address to read data of the retrieved physical address from the memory device 100 in response to the read request from the host 300.

In an embodiment, read requests received from the host 300 may be classified into a sequential read request and a random read request depending on the length of the logical address provided along with the read request. For example, the length of the logical address for classifying a sequential read request and a random read request may be 4 Kbytes. That is, when the length of the logical address provided along with the read request is 4 Kbytes or less, the corresponding read request may be classified as a random read request, whereas when the length of the logical address exceeds 4 Kbytes, the corresponding read request may be classified as a sequential read request.

In conventional technology, when a random read request is received, the memory controller 200 may first search the write cache buffer because data to be read may not yet be stored in the memory device 100. When a physical address corresponding to a logical address of the random read request is not present in the write cache buffer, the memory controller 200 searches the P2L mapping table that is the mapping table for open blocks. When the physical address corresponding to the logical address of the random read request is not present in the P2L mapping table, the memory controller finally searches the L2P mapping table to retrieve the physical address corresponding to the logical address of the random read request. If random read requests are successively provided from the host 300, the memory controller 200 may repeat a search operation in the order of the write cache buffer, the P2L mapping table, and the L2P mapping table in response to all of the random read requests. Such an operation may deteriorate the performance of the storage device 50 operating in response to random read requests, and may cause an overhead.

In an embodiment of the present disclosure, when a number of random read requests exceeding a reference number of times (reference count) are successively inputted, data stored in the write cache buffer may be stored in the memory device 100, and the L2P mapping table may be updated on the basis of the P2L mapping table, and thus physical addresses corresponding to logical addresses of the random read requests are retrieved only from the L2P mapping table. By means of this operation, performance at which the storage device 50 processes random read requests may be improved.

For this, the memory controller 200 may Include a random read workload control unit 210.

The random read workload control unit 210 may determine a search target for acquiring the logical addresses that respond to random read requests depending on whether a number of random read requests exceeding the reference number of times (reference count) are inputted from the host 300.

The structure of the random read workload control unit 210 and a method of operating the random read workload control unit 210 will be described in detail later with reference to FIGS. 6 to 10.

The host 300 may communicate with the storage device 50 using at least one of various communication methods such as Universal Serial Bus (USB), Serial AT Attachment (SATA), Serial Attached SCSI (SAS), High Speed Interchip (HSIC), Small Computer System Interface (SCSI), Peripheral Component Interconnection (PCI), PCI express (PCIe), Nonvolatile Memory express (NVMe), Universal Flash Storage (UFS), Secure Digital (SD), MultiMedia Card (MMC), embedded MMC (eMMC), Dual In-line Memory Module (DIMM), Registered DIMM (RDIMM), and Load Reduced DIMM (LRDIMM) communication methods.

Figure 2:
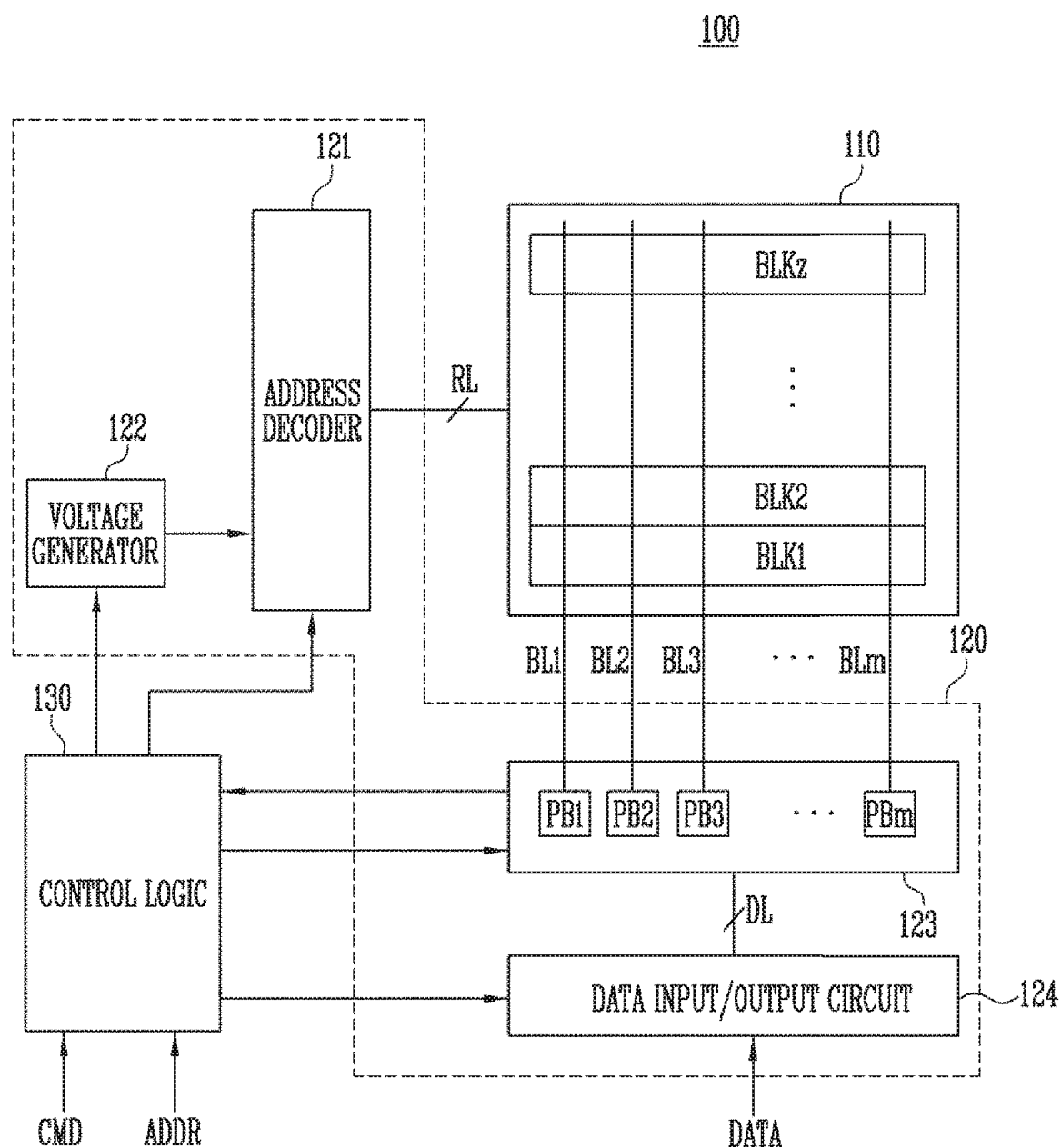
FIG. 2 is a diagram illustrating the structure of a memory device of FIG. 1.

FIG. 2 is a diagram illustrating the structure of the memory device 100.

Referring to FIG. 2, the memory device 100 may include a memory cell array 110, a peripheral circuit 120, and a control logic 130.

The memory cell array 110 includes a plurality of memory blocks BLK1 to BLKz. The plurality of memory blocks BLK1 to BLKz are coupled to an address decoder 121 through row lines RL. The memory blocks BLK1 to BLKz are coupled to a read and write circuit 123 through bit lines BL1 to BLm. Each of the memory blocks BLK1 to BLKz includes a plurality of memory cells. In an embodiment, the plurality of memory cells are nonvolatile memory cells. In the plurality of memory cells, memory cells coupled to the same word line are defined as a single page. That is, the memory cell array 110 is composed of a plurality of pages. In an embodiment, each of the plurality of memory blocks BLK1 to BLKz included in the memory cell array 110 may include a plurality of dummy cells. As the dummy cells, one or more dummy cells may be coupled in series between a drain select transistor and the memory cells and between a source select transistor and the memory cells.

The memory cells of the memory device 100 may each be Implemented as a single-level cell (SLC) capable of storing a single data bit, a multi-level cell (MLC) capable of storing two data bits, a triple-level cell (TLC) capable of storing three data bits, or a quad-level cell (QLC) capable of storing four data bits.

The peripheral circuit 120 may include an address decoder 121, a voltage generator 122, the read and write circuit 123, and a data input/output circuit 124.

The peripheral circuit 120 may drive the memory cell array 110. For example, the peripheral circuit 120 may drive the memory cell array 110 so that a program operation, a read operation, and an erase operation are performed.

The address decoder 121 is coupled to the memory cell array 110 through row lines RL. The row lines RL may include drain select lines, word lines, source select lines, and a common source line. In an embodiment, the word lines may include normal word lines and dummy word lines. In an embodiment, the row lines RL may further include a pipe select line.

The address decoder 121 is configured to be operated under the control of the control logic 130. The address decoder 121 receives the address ADDR from the control logic 130.

The address decoder 121 is configured to decode a block address of the received address ADDR. The address decoder 121 selects at least one memory block from among the memory blocks BLK1 to BLKz in response to the decoded block address. The address decoder 121 is configured to decode a row address of the received address ADDR. The address decoder 121 may select at least one word line of the selected memory block by applying voltages supplied from the voltage generator 122 to at least one word line WL in response to the decoded row address.

During a program operation, the address decoder 121 may apply a program voltage to the selected word line and apply a pass voltage having a level lower than that of the program voltage to unselected word lines. During a program verify operation, the address decoder 121 may apply a verify voltage to a selected word line and apply a verification pass voltage higher than the verify voltage to unselected word lines.

During a read operation, the address decoder 121 may apply a read voltage to a selected word line and apply a pass voltage higher than the read voltage to unselected word lines.

In an embodiment, the erase operation of the memory device 100 may be performed on a memory block basis. During an erase operation, the address ADDR input to the memory device 100 includes a block address. The address decoder 121 may decode the block address and select a single memory block in response to the decoded block address. During the erase operation, the address decoder 121 may apply a ground voltage to word lines coupled to the selected memory block.

In an embodiment, the address decoder 121 may decode a column address of the received address ADDR. A decoded column address DCA may be transferred to the read and write circuit 123. In an exemplary embodiment, the address decoder 121 may include components such as a row decoder, a column decoder, and an address buffer.

The voltage generator 122 is configured to generate a plurality of voltages using an external supply voltage provided to the memory device 1000. The voltage generator 122 is operated under the control of the control logic 130.

In an embodiment, the voltage generator 122 may generate an internal supply voltage by regulating the external supply voltage. The internal supply voltage generated by the voltage generator 122 is used as an operating voltage of the memory device 100.

In an embodiment, the voltage generator 122 may generate a plurality of voltages using an external supply voltage or an internal supply voltage. The voltage generator 122 may generate various voltages required by the memory device 100. For example, the voltage generator 122 may generate a plurality of program voltages, a plurality of pass voltages, a plurality of select read voltages, and a plurality of unselect read voltages.

For example, the voltage generator 122 may include a plurality of pumping capacitors for receiving the internal supply voltage and may generate a plurality of voltages by selectively activating the pumping capacitors under the control of the control logic 130.

The generated voltages may be supplied to the memory cell array 110 by the address decoder 121.

The read and write circuit 123 includes first to m-th page buffers PB1 to PBm. The first to m-th page buffers PB1 to PBm are coupled to the memory cell array 110 through the first to m-th bit lines BL1 to BLm, respectively. The first to m-th page buffers PB1 to PBm are operated under the control of the control logic 130.

The first to m-th page buffers PB1 to PBm perform data communication with the data input/output circuit 124. During a program operation, the first to m-th page buffers PB1 to PBm receive data to be stored DATA through the data input/output circuit 124 and data lines DL.

During a program operation, the first to m-th page buffers PB1 to PBm may transfer the data DATA, received through the data input/output circuit 124, to selected memory cells through the bit lines BL1 to BLm when a program pulse is applied to each selected word line. The memory cells in the selected page are programmed based on the transferred data DATA. Memory cells coupled to a bit line to which a program permission voltage (e.g. a ground voltage) is applied may have increased threshold voltages. Threshold voltages of memory cells coupled to a bit line to which a program prohibition voltage (e.g. a supply voltage) is applied may be maintained. During a program verify operation, the first to m-th page buffers read page data from the selected memory cells through the bit lines BL1 to BLm.

During a read operation, the read and write circuit 123 reads data DATA from the memory cells in the selected page through the bit lines BL, and outputs the read data DATA to the data input/output circuit 124.

During an erase operation, the read and write circuit 123 may allow the bit lines BL to float. In an embodiment, the read and write circuit 123 may include a column select circuit.

The data input/output circuit 124 is coupled to the first to m-th page buffers PB1 to PBm through the data lines DL. The data input/output circuit 124 is operated under the control of the control logic 130.

The data input/output circuit 124 may include a plurality of input/output buffers (not illustrated) for receiving input data. During a program operation, the data input/output circuit 124 receives data to be stored DATA from an external controller (not shown). During a read operation, the data input/output circuit 124 outputs the data, received from the first to m-th page buffers PB1 to PBm included in the read and write circuit 123, to the external controller.

The control logic 130 may be coupled to the address decoder 121, the voltage generator 122, the read and write circuit 123, and the data input/output circuit 124. The control logic 130 may control the overall operation of the memory device 100. The control logic 130 may be operated in response to a command CMD received from an external device.

Figure 3:
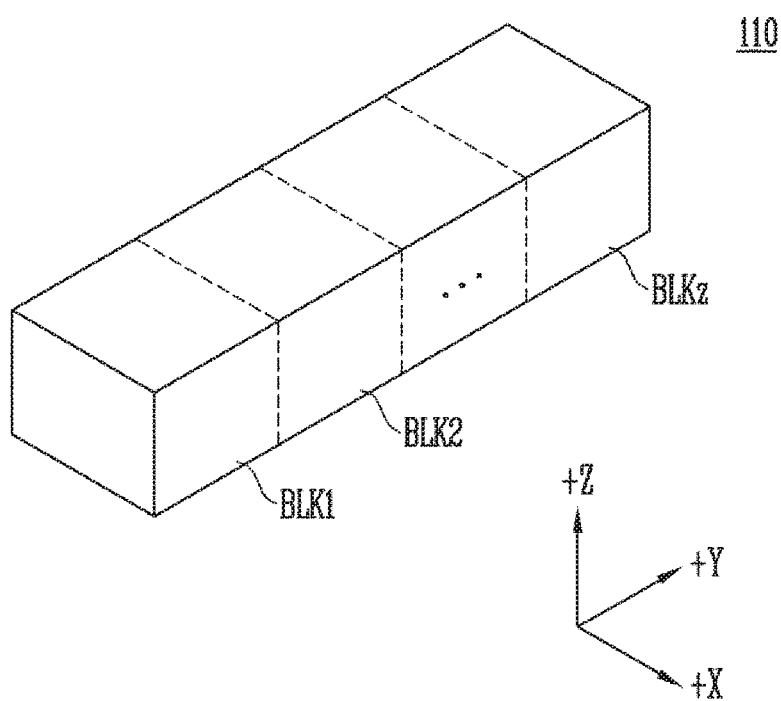
FIG. 3 is a diagram illustrating an embodiment of a memory cell array of FIG. 2.

FIG. 3 is a diagram illustrating an embodiment of the memory cell array of FIG. 2.

Referring to FIG. 3, the memory cell array 110 includes a plurality of memory blocks BLK1 to BLKz. Each memory block has a three-dimensional (3D) structure. Each memory block includes a plurality of memory cells stacked on a substrate. Such memory cells are arranged along a positive X (+X) direction, a positive Y (+Y) direction, and a positive Z (+Z) direction. The structure of each memory block will be described in detail below with reference to FIGS. 4 and 5.

Figure 4:
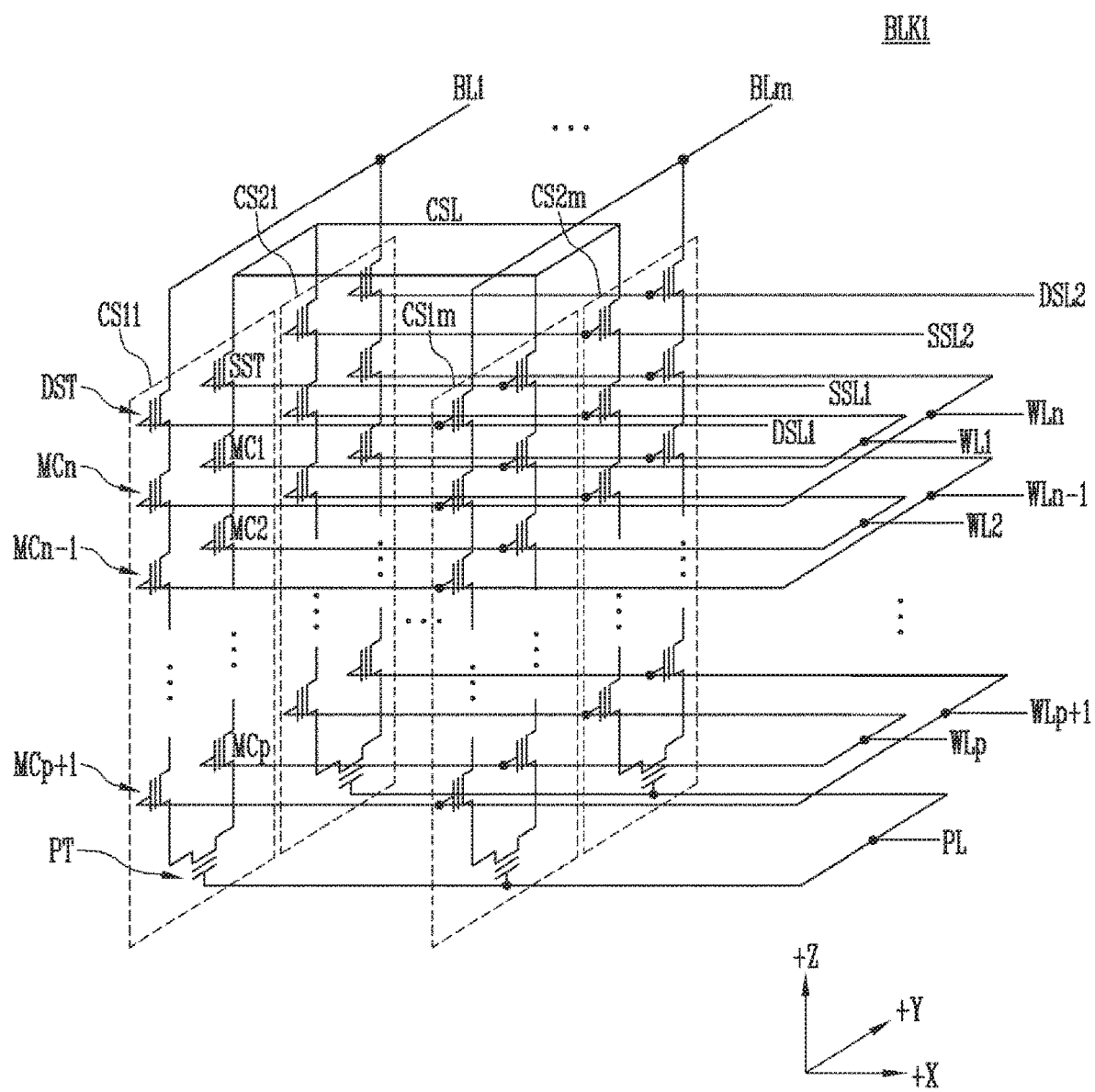
FIG. 4 is a circuit diagram illustrating any one memory block BLK1 of memory blocks BLK1 to BLKz of FIG. 3.

FIG. 4 is a circuit diagram illustrating any one (BLK1) of the memory blocks BLK1 to BLKz of FIG. 3.

Referring to FIG. 4, the first memory block BLK1 includes a plurality of cell strings CS11 to CS1m and CS21 to CS2m. In an embodiment, each of the cell strings CS11 to CS1m and CS21 to CS2m may be formed in a 'U' shape. In the first memory block BLK1, m cell strings are arranged in a row direction (i.e. a positive (+) X direction). In FIG. 4, two cell strings are shown as being arranged in a column direction (i.e. a positive (+) Y direction). However, this illustration is made for convenience of description, and it will be understood that three or more cell strings may be arranged in the column direction.

Each of the plurality of cell strings CS11 to CS1m and CS21 to CS2m includes at least one source select transistor SST, first to n-th memory cells MC1 to MCn, a pipe transistor PT, and at least one drain select transistor DST.

The select transistors SST and DST and the memory cells MC1 to MCn may have similar structures, respectively. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided to each cell string. In an embodiment, a pillar for providing at least one of the channel layer, the tunneling insulating layer, the charge storage layer, and the blocking insulating layer may be provided to each cell string.

The source select transistor SST of each cell string is connected between the common source line CSL and memory cells MC1 to MCp.

In an embodiment, the source select transistors of cell strings arranged in the same row are coupled to a source select line extended in a row direction, and source select transistors of cell strings arranged in different rows are coupled to different source select lines. In FIG. 4, source select transistors of cell strings CS11 to CS1m in a first row are coupled to a first source select line SSL1. The source select transistors of cell strings CS21 to CS2m in a second row are coupled to a second source select line SSL2.

In an embodiment, source select transistors of the cell strings CS11 to CS1m and CS21 to CS2m may be coupled in common to a single source select line.

The first to n-th memory cells MC1 to MCn in each cell string are coupled between the source select transistor SST and the drain select transistor DST.

The first to n-th memory cells MC1 to MCn may be divided into first to p-th memory cells MC1 to MCp and p+1-th to n-th memory cells MCp+1 to MCn. The first to p-th memory cells MC1 to MCp are sequentially arranged in a direction opposite a positive (+) Z direction and are connected in series between the source select transistor SST and the pipe transistor PT. The p+1-th to n-th memory cells MCp+1 to MCn are sequentially arranged in the +Z direction and are connected in series between the pipe transistor PT and the drain select transistor DST. The first to p-th memory cells MC1 to MCp and the p+1-th to n-th memory cells MCp+1 to MCn are coupled to each other through the pipe transistor PT. The gates of the first to n-th memory cells MC1 to MCn of each cell string are coupled to first to n-th word lines WL1 to WLn, respectively.

The gate of the pipe transistor PT of each cell string is coupled to a pipeline PL.

The drain select transistor DST of each cell string is connected between the corresponding bit line and the memory cells MCp+1 to MCn. The cell strings in a row direction are coupled to drain select lines extended in a row direction. Drain select transistors of cell strings CS11 to CS1m in the first row are coupled to a first drain select line DSL1. Drain select transistors of cell strings CS21 to CS2m in a second row are coupled to a second drain select line DSL2.

Cell strings arranged in a column direction are coupled to bit lines extended in a column direction. In FIG. 4, cell strings CS11 and CS21 in a first column are coupled to a first bit line BL1. Cell strings CS1m and CS2m in an m-th column are coupled to an m-th bit line BLm.

The memory cells coupled to the same word line in cell strings arranged in a row direction constitute a single page. For example, memory cells coupled to the first word line WL1, among the cell strings CS11 to CS1m in the first row, constitute a single page. Memory cells coupled to the first word line WL1, among the cell strings CS21 to CS2m in the second row, constitute a single additional page. Cell strings arranged in the direction of a single row may be selected by selecting any one of the drain select lines DSL1 and DSL2. A single page may be selected from the selected cell strings by selecting any one of the word lines WL1 to WLn.

In an embodiment, even bit lines and odd bit lines, instead of first to m-th bit lines BL1 to BLm, may be provided. Further, even-numbered cell strings, among the cell strings CS11 to CS1m or CS21 to CS2m arranged in a row direction, may be coupled to the even bit lines, respectively, and odd-numbered cell strings, among the cell strings CS11 to CS1m or CS21 to CS2m arranged in the row direction, may be coupled to the odd bit lines, respectively.

In an embodiment, one or more of the first to n-th memory cells MC1 to MCn may be used as dummy memory cells. For example, one or more dummy memory cells are provided to reduce an electric field between the source select transistor SST and the memory cells MC1 to MCp. Alternatively, the one or more dummy memory cells are provided to reduce an electric field between the drain select transistor DST and the memory cells MCp+1 to MCn. As more dummy memory cells are provided, the reliability of the operation of the memory block BLK1 is improved, but the size of the memory block BLK1 is increased. As fewer memory cells are provided, the size of the memory block BLK1 is reduced, but the reliability of the operation of the memory block BLK1 may be deteriorated.

In order to efficiently control the one or more dummy memory cells, each of the dummy memory cells may have a required threshold voltage. Before or after the erase operation of the memory block BLK1 is performed, a program operation may be performed on all or some of the dummy memory cells. When an erase operation is performed after the program operation has been performed, the threshold voltages of the dummy memory cells control the voltages that are applied to the dummy word lines coupled to respective dummy memory cells, and thus the dummy memory cells may have required threshold voltages.

Figure 5:
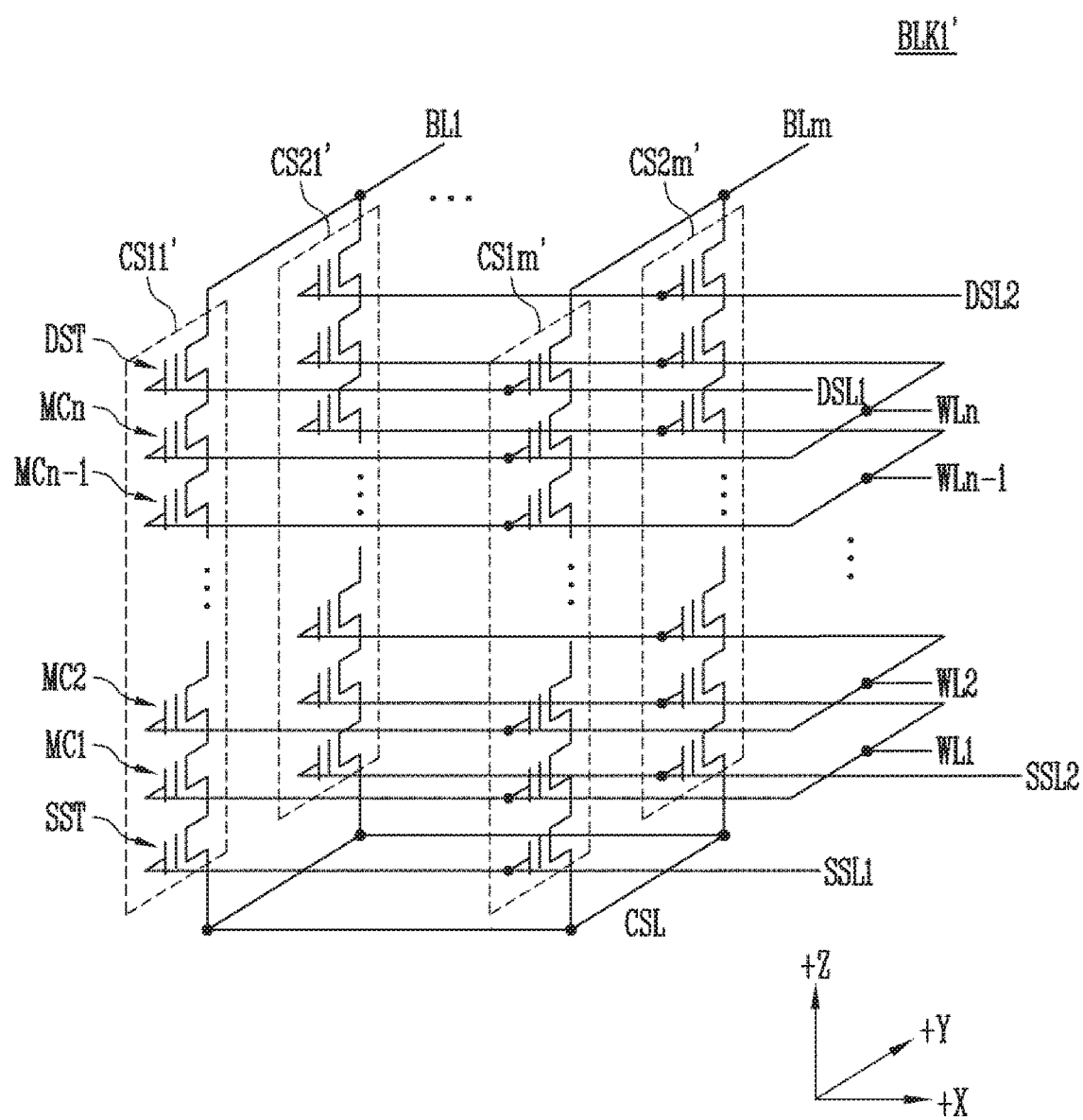
FIG. 5 is a circuit diagram illustrating an example BLK1' of any one memory block BLK1 of the memory blocks BLK1 to BLKz of FIG. 3.

FIG. 5 is a circuit diagram illustrating an example BLK1' of any one memory block BLK1 of the memory blocks BLK1 to BLKz of FIG. 3.

Referring to FIG. 5, a first memory block BLK1' includes a plurality of cell strings CS11' to CS1m' and CS21' to CS2m'. Each of the plurality of cell strings CS11' to CS1m' and CS21' to CS2m' is extended along a positive Z (+Z) direction. Each of the cell strings CS11' to CS1m' and CS21' to CS2m' includes at least one source select transistor SST, first to n-th memory cells MC1 to MCn, and at least one drain select transistor DST, which are stacked on a substrate (not illustrated) below the memory block BLK1'.

The source select transistor SST of each cell string is connected between a common source line CSL and memory cells MC1 to MCn. The source select transistors of cell strings arranged in the same row are coupled to the same source select line. Source select transistors of cell strings CS11' to CS1m' arranged in a first row are coupled to a first source select line SSL1. Source select transistors of cell strings CS21' to CS2m' arranged in a second row are coupled to a second source select line SSL2. In an embodiment, source select transistors of the cell strings CS11' to CS1m' and CS21' to CS2m' may be coupled in common to a single source select line.

The first to n-th memory cells MC1 to MCn in each cell string are connected in series between the source select transistor SST and the drain select transistor DST. The gates of the first to n-th memory cells MC1 to MCn are coupled to first to n-th word lines WL1 to WLn, respectively.

The drain select transistor DST of each cell string is connected between the corresponding bit line and the memory cells MC1 to MCn. Drain select transistors of cell strings arranged in a row direction are coupled to drain select lines extended in a row direction. The drain select transistors of the cell strings CS11' to CS1m' in the first row are coupled to a first drain select line DSL1. The drain select transistors of the cell strings CS21' to CS2m' in the second row are coupled to a second drain select line DSL2.

As a result, the memory block BLK1' of FIG. 5 has an equivalent circuit similar to that of the memory block BLK1 of FIG. 4 except that a pipe transistor PT is excluded from each cell string.

In an embodiment, even bit lines and odd bit lines, instead of first to m-th bit lines BL1 to BLm, may be provided. Further, even-numbered cell strings, among the cell strings CS11' to CS1m' or CS21' to CS2m' arranged in a row direction, may be coupled to the even bit lines, respectively, and odd-numbered cell strings, among the cell strings CS11' to CS1m' or CS21' to CS2m' arranged in the row direction, may be coupled to the odd bit lines, respectively.

In an embodiment, one or more of the first to n-th memory cells MC1 to MCn may be used as dummy memory cells. For example, the one or more dummy memory cells are provided to reduce an electric field between the source select transistor SST and the memory cells MC1 to MCn. Alternatively, the one or more dummy memory cells are provided to reduce an electric field between the drain select transistor DST and the memory cells MC1 to MCn. As more dummy memory cells are provided, the reliability of the operation of the memory block BLK1' is improved, but the size of the memory block BLK1' is increased. As fewer memory cells are provided, the size of the memory block BLK1' is reduced, but the reliability of the operation of the memory block BLK1' may be deteriorated.

In order to efficiently control the one or more dummy memory cells, each of the dummy memory cells may have a required threshold voltage. Before or after the erase operation of the memory block BLK1' is performed, a program operation may be performed on all or some of the dummy memory cells. When an erase operation is performed after the program operation has been performed, the threshold voltages of the dummy memory cells control the voltages that are applied to the dummy word lines coupled to respective dummy memory cells, and thus the dummy memory cells may have required threshold voltages.

Figure 6:
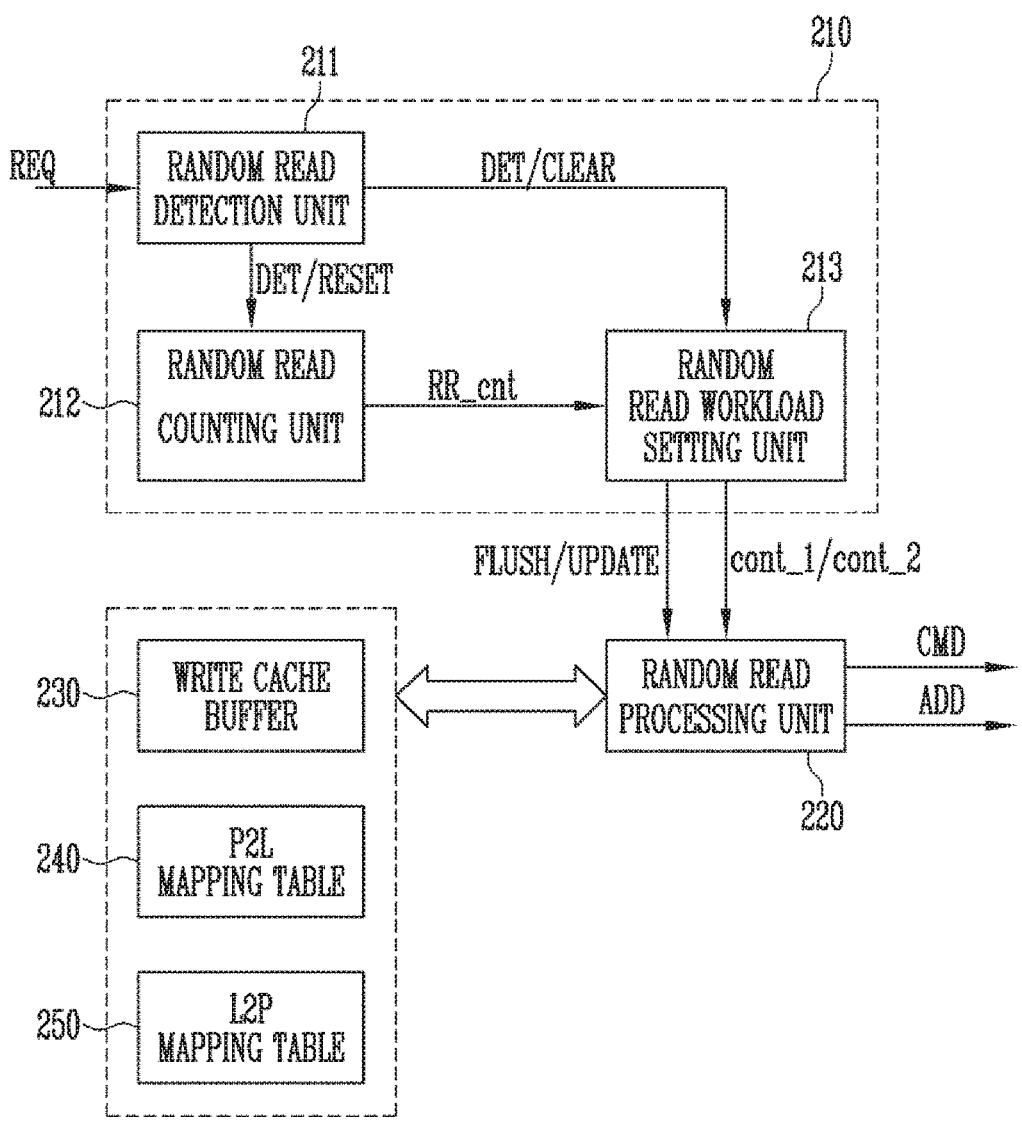
FIG. 6 is a diagram illustrating a memory controller of FIG. 1.

FIG. 6 is a block diagram illustrating the memory controller 200.

Referring to FIG. 6, the memory controller 200 may include a random read workload control unit 210, a random read processing unit 220, a write cache buffer 230, a P2L mapping table 240, and an L2P mapping table 250.

The random read workload control unit 210 may include a random read detection unit 211, a random read counting unit 212, and a random read workload setting unit 213. The random read workload control unit 210 may perform a random read operation depending on whether a random read workload has been set.

The random read detection unit 211 may receive a read request REQ inputted from an external host. The random read detection unit 211 may detect whether the received read request REQ is a random read request. The read request REQ may be classified as a sequential read request and a random read request depending on the length of a logical address provided along with the read request REQ as described above with reference to FIG. 1. However, the criterion for classifying the random read request and the sequential read request is not limited by the embodiment of the present disclosure.

When the read request REQ is a random read request, the random read detection unit 211 may output a detected signal DET to the random read counting unit 212 and the random read workload setting unit 213. When the read request REQ is not a random read request, the random read detection unit 211 may output a reset signal RESET to the random read counting unit 212 and output a clear signal CLEAR to the random read workload setting unit 213.

The random read counting unit 212 may count the number of inputs of random read requests based on the detected signal DET. For example, when the detected signal DET is inputted from the random read detection unit 211, the random read counting unit 212 may increase a random read count RR_cnt and may provide the random read count RR_cnt to the random read workload setting unit 213. When the reset signal RESET is inputted from the random read detection unit 211, the random read counting unit 212 may initialize the random read count RR_cnt to 0.

The random read workload setting unit 213 may receive the random read count RR_cnt from the random read counting unit 212. The random read workload setting unit 213 may compare the random read count RR_cnt with the reference number of times (reference count) TH. When the random read count RR_cnt is equal to or greater than the reference count TH, the random read workload setting unit 213 may set a random read workload. When the random read count RR_cnt is less than the reference count TH, the random read workload setting unit 213 may not set a random read workload.

In an embodiment, the random read workload setting unit 213 may receive a clear signal CLEAR from the random read detection unit 211. When the clear signal CLEAR is received from the random read detection unit 211, the random read workload setting unit 213 may clear the set random read workload.

In an embodiment, when the random read workload is set due to the random read count RR_cnt equal to or greater than the reference count TH, the random read workload setting unit 213 may output to the random read processing unit 220 a flush signal FLUSH for storing the data, which is stored in the write cache buffer 230, in the memory device 100 and an update signal UPDATE for updating the L2P mapping table 250 based on the P2L mapping table 240.

When the random read workload is set, the memory controller 200 may store data, which is stored in the write cache buffer 230, in the memory device 100, and may update the L2P mapping table 250 based on the P2L mapping table 240.

The random read workload setting unit 213 may receive the detected signal DET from the random read detection unit 211. The random read workload setting unit 213 may output a first control signal cont_1 or a second control signal cont_2 to the random read processing unit 220 depending on whether a random read workload has been set. For example, if the random read workload has been set, the random read workload setting unit 213 may output the first control signal cont_1, whereas if the random read workload has not been set, the random read workload setting unit 213 may output the second control signal cont_2.

The random read workload setting unit 213 may output the first control signal cont_1 upon receiving the detected signal DET from the random read detection unit 211 after the memory controller 200 stores the data of the write cache buffer 230 in the memory device 100 and updates the L2P mapping table 250 based on the P2L mapping table 240 since the random read workload is set by the random read workload setting unit 213 due to the random read count RR_cnt equal to or greater than the reference count TH.

The random read processing unit 220 may control the overall operation of the memory controller 200. The random read processing unit 220 may perform the function of firmware FW as described above with reference to FIG. 1. In an embodiment, the random read processing unit 220 may act as an FTL as described above with reference to FIG. 1. The random read processing unit 220 may provide the memory device 100 with a command CMD, an address ADD and/or data for controlling the memory device 100.

The random read processing unit 220 may receive the first control signal cont_1 or the second control signal cont_2 from the random read workload setting unit 213.

The random read processing unit 220 may search the L2P mapping table 250 to retrieve a physical address corresponding to a logical address of a currently provided random read request REQ in response to the first control signal cont_1.

The random read processing unit 220 may perform a search operation in the order of the write cache buffer 230, the P2L mapping table 240, and the L2P mapping table 250 to retrieve a physical address corresponding to a logical address of a currently provided random read request REQ in response to the second control signal cont_2. For example, the random read processing unit 220 may search the write cache buffer 230 to retrieve a physical address corresponding to a logical address of a currently provided random read request REQ. The random read processing unit 220 may subsequently search the P2L mapping table 240 if the physical address corresponding to the logical address of the currently provided random read request REQ is not retrieved from the write cache buffer 230. The random read processing unit 220 may subsequently search the L2P mapping table 250 if the physical address corresponding to the logical address of the currently provided random read request REQ is not retrieved from the P2L mapping table 240.

The random read processing unit 220 may retrieve the physical address ADD corresponding to the logical address of the currently provided random read request REQ by searching the write cache buffer 230, the P2L mapping table 240, and the L2P mapping table 250. The random read processing unit 220 may transmit the read command CMD and the retrieved physical address ADD to the memory device 100.

Figure 7:
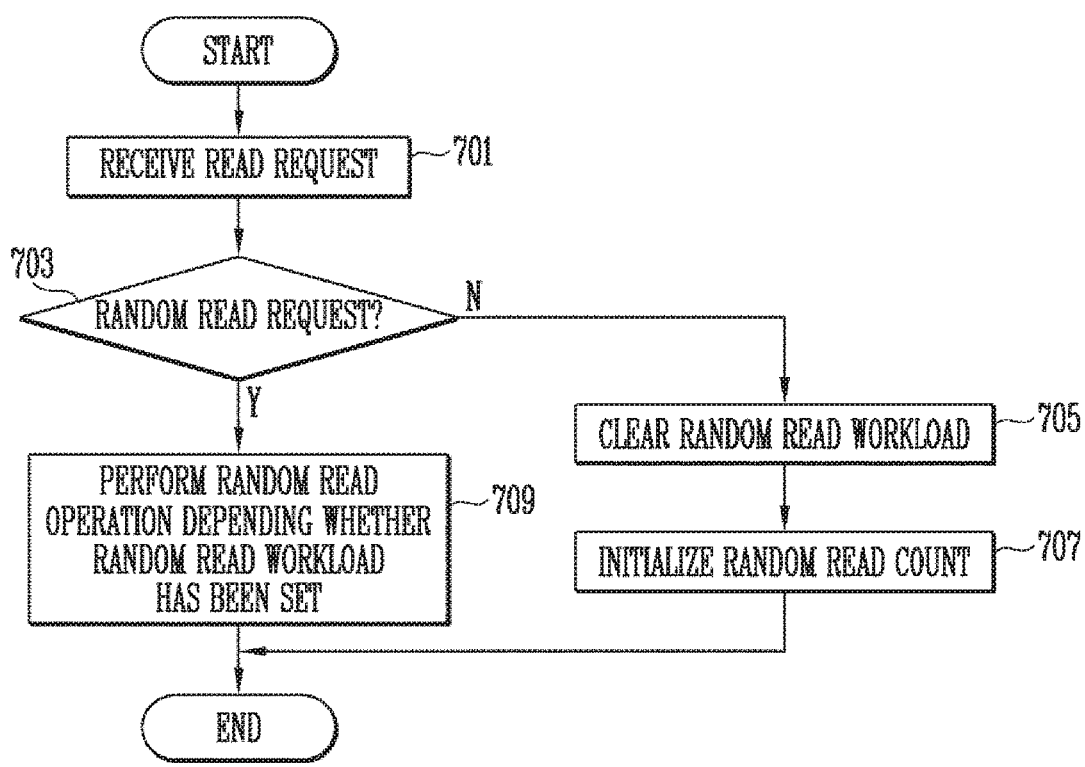
FIG. 7 is a flowchart for explaining an operation of the memory controller according to an embodiment of the present disclosure.

FIG. 7 is a flowchart illustrating the operation of the memory controller 200 according to an embodiment of the present disclosure.

Referring to FIG. 7, the memory controller 200 may receive a read request REQ from an external host at step 701.

At step 703, the memory controller 200 may determine whether the received read request REQ is a random read request. Whether the read request REQ is a random read request may be determined depending on the length of the logical address that is inputted along with the read request REQ. In an embodiment, when the length of the logical address inputted along with the read request REQ is 4 Kbytes or less, the read request REQ may be a random read request. As a result of the determination, if the read request REQ is the random read request, the process proceeds to step 709, otherwise the process proceeds to step 705.

At step 705, the memory controller 200 may clear the random read workload. The memory controller 200 performs a random read operation depending on whether the random read workload has been set. The random read workload may be set when a predetermined number of random read requests or more are sequentially inputted. If a read request other than the random read request is inputted in a state in which the random read workload has been set, the memory controller 200 may clear the random read workload.

At step 707, the memory controller may initialize a random read count RR_cnt. The random read count RR_cnt may be used to determine whether to set the random read workload.

At step 709, the memory controller 200 may perform a random read operation depending on whether the random read workload has been set. A method of performing the random read operation at step 709 will be described in detail below with reference to FIG. 8.

Figure 8:
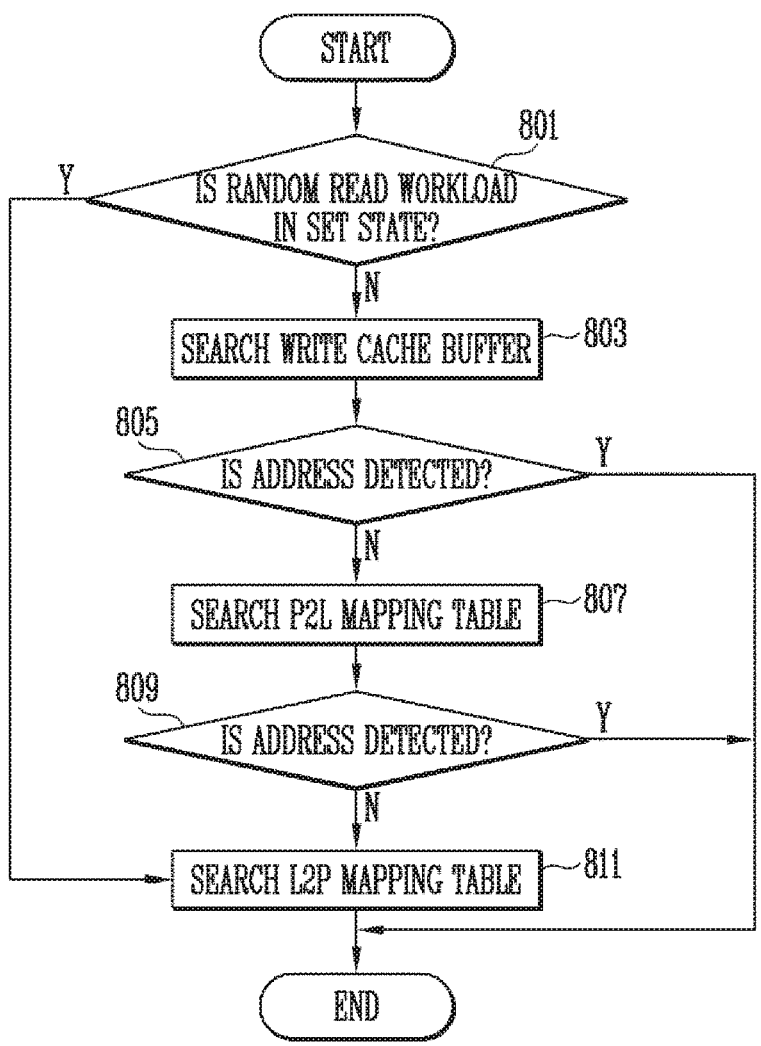
FIG. 8 is a flowchart for explaining a method of performing a random read operation depending on whether a random read workload has been set in FIG. 7.

FIG. 8 is a flowchart illustrating a method of performing the random read operation depending on whether the random read workload has been set in FIG. 7.

In an embodiment, steps 801 to 811 of FIG. 8 may correspond to step 709 of FIG. 7.

Referring to FIG. 8, the memory controller 200 may determine whether the random read workload is set at step 801. The random read workload may be set or may not be set depending on the number of random read requests REQ that are previously inputted. As a result of the determination, if the random read workload is set, the process proceeds to step 811 in response to the first control signal cont_1 corresponding to a currently provided random read request REQ, whereas if the random read workload is not set, the process proceeds to step 803 in response to the second control signal cont_2 corresponding to a currently provided random read request REQ. The first and second control signals cont_1 and cont_2 is described with reference to FIG. 6.

At steps 803 to 811, the memory controller 200 may perform a search operation in the order of the write cache buffer 230, the P2L mapping table 240, and the L2P mapping table 250 to retrieve a physical address corresponding to a logical address of a currently provided random read request REQ.

In detail, at step 803, the memory controller 200 may search the write cache buffer 230 to retrieve a physical address corresponding to a logical address of a currently provided random read request REQ. The write cache buffer 230 may store data to be stored in the memory device 100 in response to a write request previously made by the host, and a logical address corresponding to the data.

At step 805, the memory controller 200 determines whether the physical address corresponding to the logical address of the currently provided random read request REQ is present in the write cache buffer 230. If it is determined that the physical address corresponding to the logical address of the currently provided random read request REQ is present in the write cache buffer 230, data corresponding to the logical address may be read out to the host, and the random read operation may be terminated. Alternatively, if it is determined that the physical address corresponding to the logical address of the currently provided random read request REQ is not present in the write cache buffer 230, the process proceeds to step 807.

At step 807, the memory controller may search the P2L mapping table 240 to retrieve the physical address corresponding to the logical address of the currently provided random read request REQ. The P2L mapping table 240 may be a mapping table for open blocks as described with reference to FIG. 1. Alternatively, the P2L mapping table 240 may store physical addresses of open blocks in which data is most recently stored.

At step 809, the memory controller 200 determines whether the physical address corresponding to the logical address of the currently provided random read request REQ is present in the P2L mapping table 240. If it is determined that the physical address corresponding to the logical address of the currently provided random read request REQ is present in the P2L mapping table 240, a read command along with the retrieved physical address may be transmitted to the memory device 100. Alternatively, if it is determined that the physical address corresponding to the logical address of the currently provided random read request REQ is not present in the P2L mapping table 240, the process proceeds to step 811.

At step 811, the memory controller 200 may search the L2P mapping table 250 to retrieve the physical address corresponding to the logical address of the currently provided random read request REQ. The L2P mapping table 250 may be a mapping table for writing-completed blocks (closed blocks) as described with reference to FIG. 1. The memory controller 200 may retrieve the physical address corresponding to the logical address of the currently provided random read request REQ from the L2P mapping table 250, and the memory controller 200 may transmit a read command along with the retrieved physical address to the memory device 100.

In accordance with the embodiment of the present disclosure, when the random read workload is determined as set at step 801, the memory controller 200 may directly search the L2P mapping table 250 without searching the write cache buffer 230 and the P2L mapping table 240, thereby directly retrieving a physical address corresponding to a logical address of a currently provided random read request REQ from the L2P mapping table 250. As described above with reference to FIG. 6, when the random read workload is set, the memory controller 200 may store the data, stored in the write cache buffer 230, in the memory device 100. When the data, stored in the write cache buffer 230, is stored in the memory device 100, the logical address and the physical address of the corresponding data may be stored in the P2L mapping table 240. The memory controller 200 may update the L2P mapping table 250 based on the P2L mapping table 240 when the random read workload is set. Therefore, when the random read workload is set, the memory controller 200 may retrieve a physical address corresponding to a logical address of a currently provided random read request REQ by searching only the L2P mapping table 250.

Figure 9:
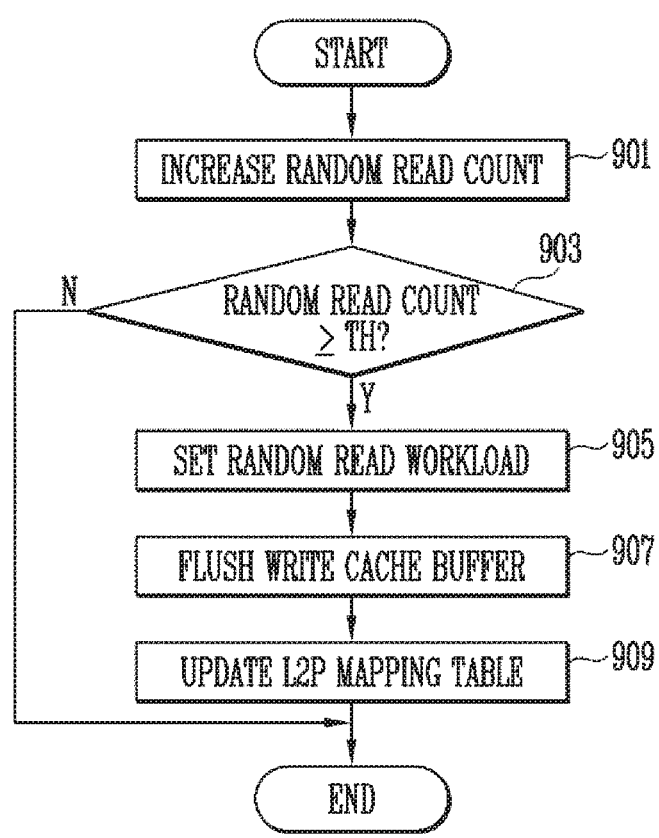
FIG. 9 is a flowchart for explaining an operation of setting a random read workload according to an embodiment of the present disclosure.

FIG. 9 is a flowchart illustrating an operation of setting a random read workload according to an embodiment of the present disclosure. Steps 901 to 909 of FIG. 9 may correspond to step 709 of FIG. 7.

Referring to FIG. 9, at step 901, the memory controller 200 increases a random read count RR_cnt. Whenever a random read request REQ is inputted, the memory controller 200 may increase the random read count RR_cnt.

At step 903, the memory controller 200 may determine whether the random read count RR_cnt is equal to or greater than the reference number of times (reference count) TH.

The reference count TH will be described in detail below. First, the time required to store data, stored in the write cache buffer 230 in the memory device 100 (FLUSH) and to update the L2P mapping table 250 based on the P2L mapping table 240 (UPDATE) is assumed to be t1. Further, the time required to perform a search operation in the order of the write cache buffer 230, the P2L mapping table 240, and the L2P mapping table 250 to retrieve physical addresses corresponding to logical addresses of respective N random read requests is assumed to be t2. A value of N at which t1 becomes equal to or less than t2, that is, the minimum value of N when t1 becomes less than or equal to t2, may be the reference count TH.

At step 903, when the random read count RR_cnt is equal to or greater than the reference count TH, the process proceeds to step 905, whereas when the random read count RR_cnt is less than the reference count TH, the random read workload remains clear.

At step 905, the memory controller 200 may set the random read workload. That is, the memory controller 200 may change the state of the random read workload from a clear state to a set state.

At step 907, the memory controller 200 stores data, stored in the write cache buffer 230, in the memory device 100. An operation of storing the data, stored in the write cache buffer 230, in the memory device 100 is referred to as a "flush operation". When the data, stored in the write cache buffer 230, is stored in the memory device 100, the logical address and the physical address of the corresponding data may be stored in the P2L mapping table 240.

At step 909, the memory controller 200 may update the L2P mapping table 250 based on the P2L mapping table 240.

Figure 10:
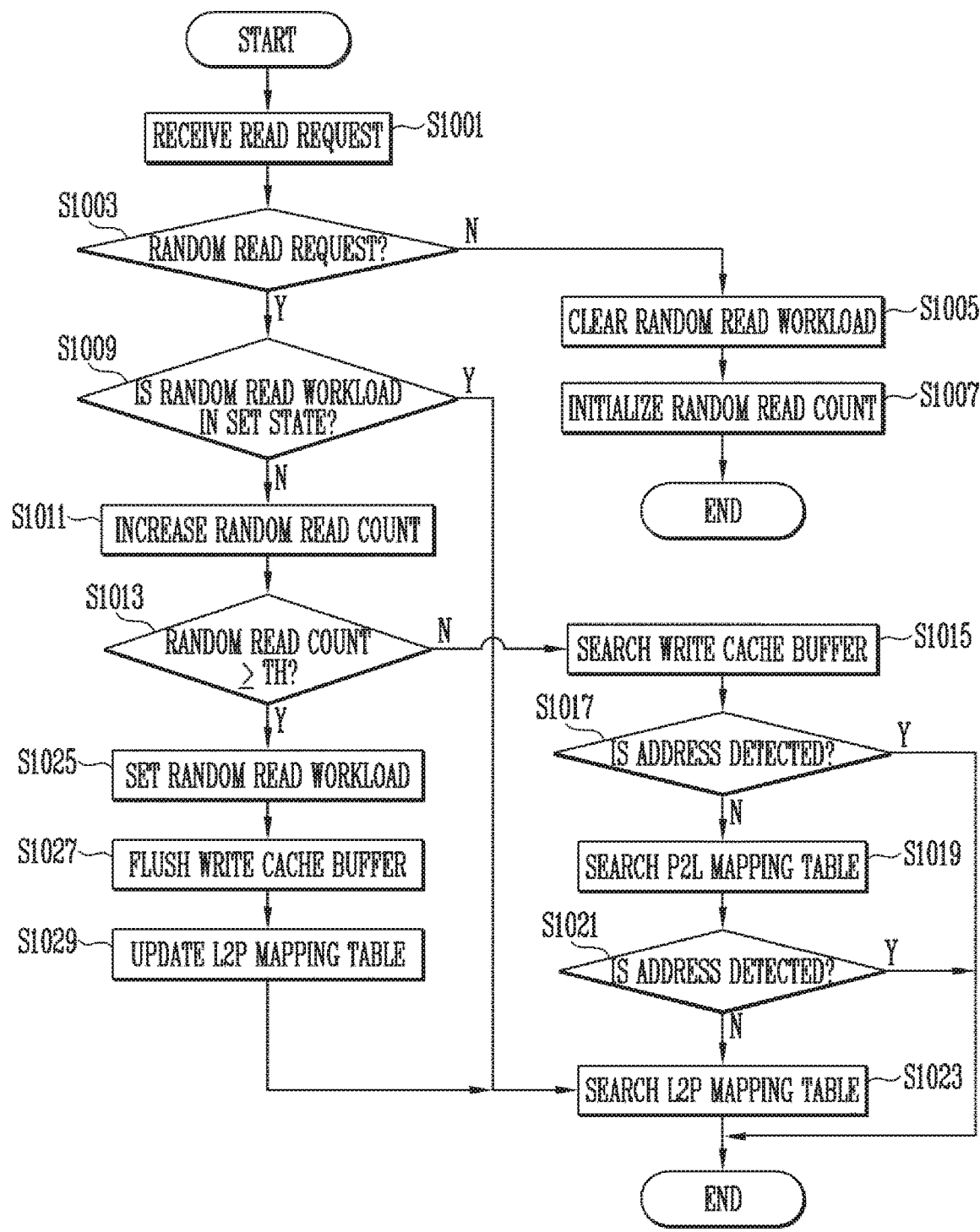
FIG. 10 is a flowchart for explaining an operation of the memory controller according to an embodiment of the present disclosure.

FIG. 10 is a flowchart illustrating the operation of the memory controller 200 according to an embodiment of the present disclosure.

Referring to FIG. 10, the memory controller 200 may receive a read request REQ from an external host at step S1001.

At step S1003, the memory controller 200 may determine whether the received read request REQ is a random read request. Whether the read request REQ is a random read request may be determined depending on the length of the logical address that is Inputted along with the read request REQ, as described with reference to FIG. 1. If it is determined that the read request REQ is the random read request, the process proceeds to step S1009, otherwise the process proceeds to step S1005.

At step S1005, the memory controller 200 may clear a random read workload. The random read workload may be set when the N number of random read requests REQs are sequentially inputted. If a read request REQ other than the random read request is inputted in a state in which the random read workload has been set, the memory controller 200 may clear the random read workload.

At step S1007, the memory controller 200 may initialize a random read count RR_cnt. The random read count RR_cnt may be used to determine whether to set the random read workload. Thereafter, the memory controller 200 may process read requests REQs other than the random read request according to a preset scheme.

At step S1009, the memory controller 200 may determine whether the random read workload is set. The random read workload may be set depending on the number of random read requests that are previously inputted. As a result of the determination, if the random read workload is set, the process proceeds to step S1023, whereas if the random read workload is not set, the process proceeds to step S1011.

At step S1011, the memory controller 200 increases the random read count RR_cnt.

At step S1013, the memory controller 200 may determine whether the random read count RR_cnt is equal to or greater than the reference count TH. The value of the reference count TH is described above with reference to step 903 of FIG. 9.

At step S1013, if the random read count RR_cnt is equal to or greater than the reference count TH, the process proceeds to step S1025, whereas if the random read count is less than the reference count TH, the process proceeds to step S1015.

At step S1015, the memory controller 200 may search the write cache buffer 230 to retrieve a physical address corresponding to a logical address of a currently provided random read request REQ in response to the second control signal cont_2. The write cache buffer 230 may store data to be stored in the memory device 100 in response to a write request previously made by the host and a logical address corresponding to the data.

At step S1017, the memory controller 200 determines whether the physical address corresponding to the logical address of the currently provided random read request REQ Is present in the write cache buffer 230. If it is determined that the physical address corresponding to the logical address of the currently provided random read request REQ is present in the write cache buffer 230, data corresponding to the logical address may be read out to the host, and the random read operation may be terminated. Alternatively, if it is determined that the physical address corresponding to the logical address of the currently provided random read request REQ is not present in the write cache buffer 230, the process proceeds to step S1019.

At step S1019, the memory controller may search the P2L mapping table 240 to retrieve the physical address corresponding to the logical address of the currently provided random read request REQ. The P2L mapping table 240 may be a mapping table for open blocks as described with reference to FIG. 1. Alternatively, the P2L mapping table 240 may store physical addresses of open blocks in which data is most recently stored.

At step S1021, the memory controller 200 determines whether the physical address corresponding to the logical address of the currently provided random read request REQ is present in the P2L mapping table 240. If it is determined that the physical address corresponding to the logical address of the currently provided random read request REQ is present in the P2L mapping table 240, a read command along with the retrieved physical address may be transmitted to the memory device 100. Alternatively, if it is determined that the physical address corresponding to the logical address of the currently provided random read request REQ is not present in the P2L mapping table 240, the process proceeds to step S1023.

At step S1023, the memory controller 200 may search the L2P mapping table 250 to retrieve the physical address corresponding to the logical address of the currently provided random read request REQ. The L2P mapping table 250 may be a mapping table for writing-completed blocks (closed blocks) as described with reference to FIG. 1. The memory controller 200 may retrieve the physical address corresponding to the logical address of the currently provided random read request REQ from the L2P mapping table 250, and the memory controller 200 may transmit a read command along with the retrieved physical address to the memory device 100.

At step S1025, the memory controller 200 may set the random read workload. That is, the memory controller 200 may change the state of the random read workload from a clear state to a set state.

At step S1027, the memory controller 200 stores data, stored in the write cache buffer 230, in the memory device 100. An operation of storing the data, stored in the write cache buffer 230, in the memory device 100 is referred to as a "flush operation". When the data, stored in the write cache buffer 230, is stored in the memory device 100, the logical address and the physical address of the corresponding data may be stored in the P2L mapping table 240.

At step S1029, the memory controller 200 may update the L2P mapping table 250 based on the P2L mapping table 240. Thereafter, the memory controller 200 may proceed to step S1023 where the L2P mapping table 250 may be searched to retrieve a physical address corresponding to a logical address of a currently provided random read request REQ. The memory controller 200 may retrieve the physical address corresponding to the logical address of the currently provided random read request REQ from the L2P mapping table 250, and the memory controller 200 may transmit a read command along with the retrieved physical address to the memory device 100.

Figure 11:
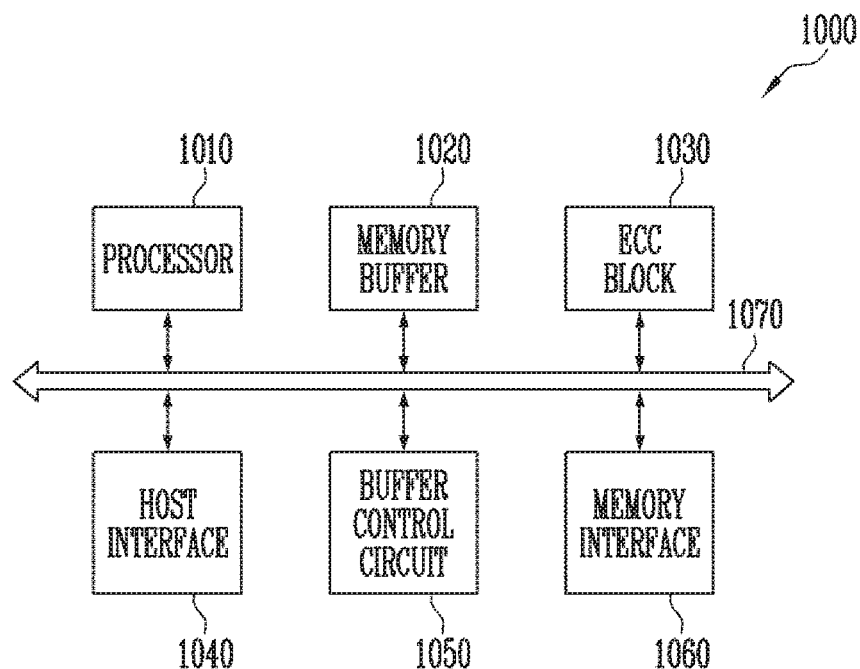
FIG. 11 is a diagram illustrating an embodiment of the memory controller of FIG. 1.

FIG. 11 is a diagram illustrating an embodiment of the memory controller of FIG. 1.

A memory controller 1000 is coupled to a host and a memory device. In response to a request from the host, the memory controller 1000 may access the memory device. For example, the memory controller 1000 may control write, read, erase, and background operations of the memory device. The memory controller 1000 may provide an interface between the memory device and the host. The memory controller 1000 may run firmware for controlling the memory device.

Referring to FIG. 11, the memory controller 1000 may include a processor 1010, a memory buffer 1020, an error correction code (ECC) block 1030, a host interface 1040, a buffer control circuit 1050, a memory interface 1060, and a bus 1070.

The bus 1070 may provide channels between components of the memory controller 1000.

The processor 1010 may control the overall operation of the memory controller 1000 and may perform a logical operation. The processor 1010 may communicate with an external host through the host interface 1040 and also communicate with the memory device through the memory interface 1060. Further, the processor 1010 may communicate with the memory buffer 1020 through the buffer control circuit 1050. The processor 1010 may control the operation of the storage device by using the memory buffer 1020 as a working memory, a cache memory or a buffer memory.

The processor 1010 may perform the function of a flash translation layer (FTL). The processor 1010 may translate a logical block address (LBA), provided by the host, into a physical block address (PBA) through the FTL. The FTL may receive the LBA using a mapping table and translate the LBA into the PBA. Examples of an address mapping method performed through the FTL may include various methods according to a mapping unit. Representative address mapping methods include a page mapping method, a block mapping method, and a hybrid mapping method.

The processor 1010 may randomize data received from the host. For example, the processing unit 1010 may use a randomizing seed to randomize data received from the host. The randomized data may be provided, as data to be stored, to the memory device and may be programmed in the memory cell array.

The processor may derandomize data received from the memory device during a read operation. For example, the processor 1010 may derandomize the data received from the memory device using a derandomizing seed. The derandomized data may be outputted to the host.

In an embodiment, the processor 1010 may run software or firmware to perform randomizing and derandomizing operations.

In an embodiment, the processor 1010 may perform the operations of the random read workload control unit 210 and the random read processing unit 220, which have been described above with reference to FIGS. 1 to 6. For example, the processor 1010 may run firmware that performs an operation of acquiring a logical address corresponding to a random read request depending on the random read workload. The firmware that performs the operation of acquiring a logical address corresponding to a random read request depending on the random read workload may run based on the method of operating the memory controller, described above with reference to FIGS. 6 to 10.

The memory buffer 1020 may be used as a working memory, a cache memory, or a buffer memory of the processor 1010. The memory buffer 1020 may store codes and commands executed by the processor 1010. The memory buffer 1020 may store data that is processed by the processor 1010. The memory buffer 1020 may include a static RAM (SRAM) or a dynamic RAM (DRAM).

The ECC block 1030 may perform error correction. The ECC block 1030 may perform ECC encoding based on data to be written to the memory device through the memory interface 1060. The ECC-encoded data may be transferred to the memory device through the memory interface 1060. The ECC block 1030 may perform ECC decoding based on data received from the memory device through the memory interface 1060. In an example, the ECC block 1030 may be included as the component of the memory interface 1060 in the memory interface 1060.

The host interface 1040 may communicate with the external host under the control of the processor 1010. The host interface 1040 may perform communication methods using at least one of various communication methods such as Universal Serial Bus (USB), Serial AT Attachment (SATA), Serial Attached SCSI (SAS), High Speed Interchip (HSIC), Small Computer System Interface (SCSI), Peripheral Component Interconnection (PCI), PCI express (PCIe), Nonvolatile Memory express (NVMe), Universal Flash Storage (UFS), Secure Digital (SD), MultiMedia Card (MMC), embedded MMC (eMMC), Dual In-line Memory Module (DIMM), Registered DIMM (RDIMM), and Load Reduced DIMM (LRDIMM) communication methods.

The buffer control circuit 1050 may control the memory buffer 1020 under the control of the processor 1010.

The memory interface 1060 may communicate with the memory device under the control of the processor 1010. The memory interface 1060 may transmit/receive commands, addresses, and data to/from the memory device through channels.

In an embodiment, the memory controller 1000 may not include the memory buffer 1020 and the buffer control circuit 1050.

In an embodiment, the processor 1010 may control the operation of the memory controller 1000 using codes. The processor 1010 may load codes from a nonvolatile memory device (e.g., ROM) provided in the memory controller 1000. In an embodiment, the processor 1010 may load codes from the memory device through the memory interface 1060.

In an embodiment, the bus 1070 of the memory controller 1000 may be divided into a control bus and a data bus. The data bus may transmit data in the memory controller 1000, and the control bus may transmit control information such as commands or addresses in the memory controller 1000. The data bus and the control bus may be isolated from each other, and may neither interfere with each other nor influence each other. The data bus may be coupled to the host interface 1040, the buffer control circuit 1050, the ECC block 1030, and the memory interface 1060. The control bus may be coupled to the host interface 1040, the processor 1010, the buffer control circuit 1050, the memory buffer 1020, and the memory interface 1060.

Figure 12:
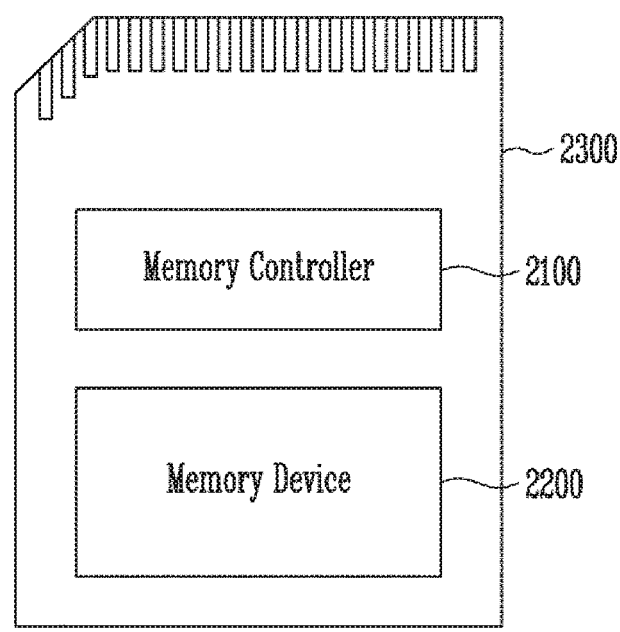
FIG. 12 is a block diagram illustrating a memory card system according to an embodiment of the present disclosure.

FIG. 12 is a block diagram illustrating a memory card system to which the storage device according to an embodiment of the present disclosure is applied.

Referring to FIG. 12, a memory card system 2000 may include a controller 2100, a memory device 2200, and a connector 2300.

The controller 2100 is coupled to the memory device 2200. The controller 2100 may access the memory device 2200. For example, the controller 2100 may be control read, write, erase, and background operations of the memory device 2200. The controller 2100 may provide an interface between the memory device 2200 and a host. The controller 2100 may run firmware for controlling the memory device 2200. The controller 2100 may be implemented in the same way as the memory controller 200, described above with reference to FIG. 1.

In an embodiment, the controller 2100 may include components, such as a RAM, a processing unit, a host interface, a memory interface, and an ECC block.

The controller 2100 may communicate with an external device through the connector 2300. The controller 2100 may communicate with an external device (e.g., a host) based on a specific communication protocol. In an embodiment, the controller 2100 may communicate with the external device through at least one of various communication protocols such as universal serial bus (USB), multimedia card (MMC), embedded MMC (eMMC), peripheral component interconnection (PCI), PCI-express (PCI-E), advanced technology attachment (ATA), serial-ATA (SATA), parallel-ATA (PATA), small computer small interface (SCSI), enhanced small disk interface (ESDI), integrated drive electronics (IDE), Firewire, universal flash storage (UFS), WI-Fi, Bluetooth, and nonvolatile memory express (NVMe) protocols. In an embodiment, the connector 2300 may be defined by at least one of the above-described various communication protocols.

In an embodiment, the memory device 2200 may be implemented as any of various nonvolatile memory devices, such as an Electrically Erasable and Programmable ROM (EEPROM), a NAND flash memory, a NOR flash memory, a Phase-change RAM (PRAM), a Resistive RAM (Re-RAM), a Ferroelectric RAM (FRAM), a Spin-Torque Magnetic RAM (STT-MRAM).

In an embodiment, the controller 2100 or the memory device 2200 may be packaged in a type such as Package on Package (PoP), Ball grid arrays (BGAs), Chip scale packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), System In Package (SIP), Multi Chip Package (MCP), Wafer-level Fabricated Package (WFP), Wafer-Level Processed Stack Package (WSP), or the like, and may be provided as a single semiconductor package. Alternatively, the memory device 2200 may include a plurality of nonvolatile memory chips, which may be packaged based on the above-described package types and may be provided as a single semiconductor package.

In an embodiment, the controller 2100 and the memory device 2200 may be integrated into a single semiconductor device. In an embodiment, the controller 2100 and the memory device 2200 may be integrated into a single semiconductor device to configure a solid state drive (SSD). The controller 2100 and the memory device 2200 may be integrated into a single semiconductor device to configure a memory card. For example, the controller 2100 and the memory device 2200 may be integrated into a single semiconductor device to configure a memory card such as a PC card (personal computer memory card international association: PCMCIA), a compact flash card (CF), a smart media card (SM or SMC), a memory stick, a multimedia card (MMC, RS-MMC, MMCmicro or eMMC), a SD card (SD, miniSD, microSD, or SDHC), or a universal flash storage (UFS).

In an embodiment, the memory device 2200 may be operated in the same way as the memory device, described above with reference to FIGS. 1 to 5. The controller 2100 may be operated in the same way as the memory controller, described above with reference to FIGS. 1 and 6 to 10.

Figure 13:
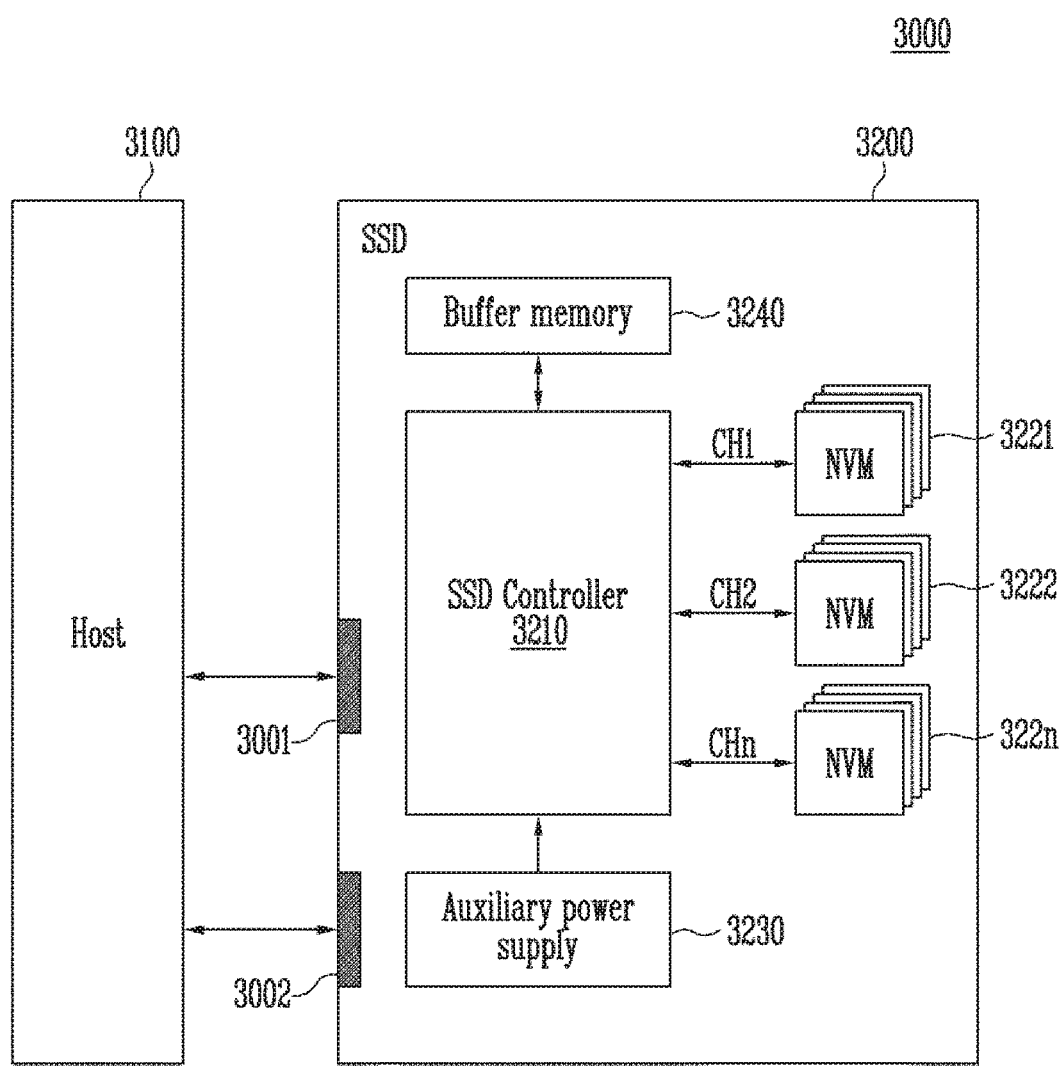
FIG. 13 is a block diagram illustrating a Solid State Drive (SSD) system according to an embodiment of the present disclosure.

FIG. 13 is a block diagram illustrating an example of a solid state drive (SSD) system to which the storage device according to an embodiment of the present disclosure is applied.

Referring FIG. 13, an SSD system 3000 may include a host 3100 and an SSD 3200. The SSD 3200 may exchange signals SIG with the host 3100 through a signal connector 3001 and may receive power PWR through a power connector 3002. The SSD 3200 may include an SSD controller 3210, a plurality of flash memories 3221 to 322n, an auxiliary power supply 3230, and a buffer memory 3240.

In an embodiment, the SSD controller 3210 may perform the function of the memory controller 200, described above with reference to FIG. 1.

The SSD controller 3210 may control the plurality of flash memories 3221 to 322n in response to the signals SIG received from the host 3100. In an embodiment, the signals SIG may be signals based on the interfaces of the host 3100 and the SSD 3200. For example, the signals SIG may be signals defined by at least one of various interfaces such as universal serial bus (USB), multimedia card (MMC), embedded MMC (eMMC), peripheral component interconnection (PCI), PCI-express (PCI-E), advanced technology attachment (ATA), serial-ATA (SATA), parallel-ATA (PATA), small computer small interface (SCSI), enhanced small disk interface (ESDI), integrated drive electronics (IDE), Firewire, universal flash storage (UFS), Wi-Fi, Bluetooth, and nonvolatile memory express (NVMe) interfaces.

The auxiliary power supply 3230 may be coupled to the host 3100 through the power connector 3002. The auxiliary power supply 3230 may be supplied with power PWR from the host 3100 and may be charged. The auxiliary power supply 3230 may supply the power of the SSD 3200 when the supply of power from the host 3100 is not smoothly performed. In an embodiment, the auxiliary power supply 3230 may be positioned inside the SSD 3200 or positioned outside the SSD 3200. For example, the auxiliary power supply 3230 may be disposed in a main board and may supply auxiliary power to the SSD 3200.

The buffer memory 3240 functions as a buffer memory of the SSD 3200. For example, the buffer memory 3240 may temporarily store data received from the host 3100 or data received from the plurality of flash memories 3221 to 322n or may temporarily store metadata (e.g., mapping tables) of the flash memories 3221 to 322n. The buffer memory 3240 may include volatile memories such as DRAM, SDRAM, DDR SDRAM, LPDDR SDRAM, and GRAM or nonvolatile memories such as FRAM, ReRAM, STT-MRAM, and PRAM.

In an embodiment, the memory devices 3221 to 322n may be operated in the same way as the memory device, described above with reference to FIGS. 1 to 5. The SSD controller 3210 may be operated in the same way as the memory controller, described above with reference to FIGS. 1 and 6 to 10.

Figure 14:
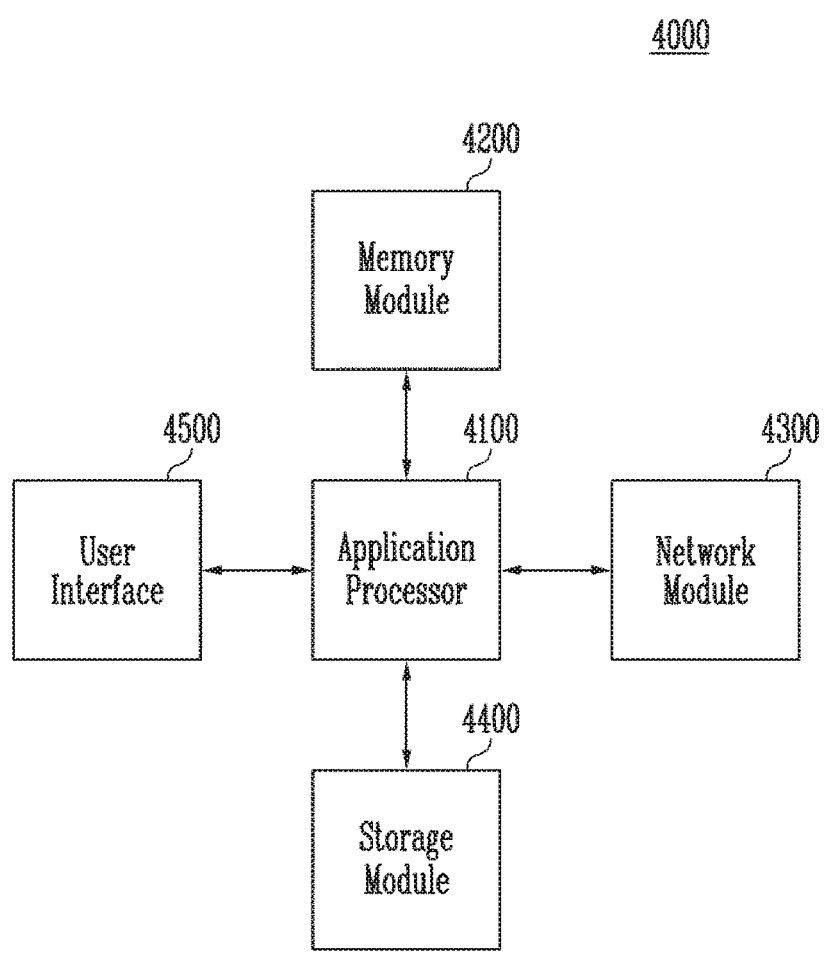
FIG. 14 is a block diagram illustrating a user system according to an embodiment of the present disclosure.

FIG. 14 is a block diagram illustrating a user system to which the storage device according to an embodiment of the present disclosure is applied.

Referring to FIG. 14, a user system 4000 may include an application processor 4100, a memory module 4200, a network module 4300, a storage module 4400, and a user interface 4500.

The application processor 4100 may run components included in the user system 4000, an Operating System (OS) or a user program. In an embodiment, the application processor 4100 may include controllers, interfaces, graphic engines, etc. for controlling the components included in the user system 4000. The application processor 4100 may be provided as a system-on-chip (SoC).

The memory module 4200 may function as a main memory, a working memory, a buffer memory or a cache memory of the user system 4000. The memory module 4200 may include volatile RAMs such as DRAM, SDRAM, DDR SDRAM, DDR2 SDRAM, DDR3 SDRAM, LPDDR SDARM, and LPDDR3 SDRAM, or nonvolatile RAMs such as PRAM, ReRAM, MRAM, and FRAM. In an embodiment, the application processor 4100 and the memory module 4200 may be packaged based on package-on-package (POP) and may then be provided as a single semiconductor package.

The network module 4300 may communicate with external devices. For example, the network module 4300 may support wireless communication, such as Code Division Multiple Access (CDMA), Global System for Mobile communication (GSM), wideband CDMA (WCDMA), CDMA- 2000, Time Division Multiple Access (TDMA), Long Term Evolution (LTE), WiMAX, WLAN, UWB, Bluetooth, or Wi-Fi communication. In an embodiment, the network module 4300 may be included in the application processor 4100.

The storage module 4400 may store data. For example, the storage module 4400 may store data received from the application processor 4100. Alternatively, the storage module 4400 may transmit the data stored in the storage module 4400 to the application processor 4100. In an embodiment, the storage module 4400 may be implemented as a nonvolatile semiconductor memory device, such as a Phase-change RAM (PRAM), a Magnetic RAM (MRAM), a Resistive RAM (RRAM), a NAND flash memory, a NOR flash memory, or a NAND flash memory having a three-dimensional (3D) structure. In an embodiment, the storage module 4400 may be provided as a removable storage medium (i.e., removable drive), such as a memory card or an external drive of the user system 400.

In an embodiment, the storage module 4400 may include a plurality of nonvolatile memory devices, and the plurality of nonvolatile memory devices may be operated in the same way as the memory device, described above with reference to FIGS. 1 to 5. The storage module 4400 may be operated in the same way as the storage device 50, described above with reference to FIG. 1.

The user interface 4500 may include interfaces which input data or instructions to the application processor 4100 or output data to an external device. In an embodiment, the user interface 4500 may include user input interfaces such as a keyboard, a keypad, a button, a touch panel, a touch screen, a touch pad, a touch ball, a camera, a microphone, a gyroscope sensor, a vibration sensor, and a piezoelectric device. The user interface 4500 may further include user output interfaces such as a Liquid Crystal Display (LCD), an Organic Light Emitting Diode (OLED) display device, an Active Matrix OLED (AMOLED) display device, an LED, a speaker, and a motor.

In accordance with the present disclosure, there are provided a storage device having improved read performance and a method of operating the storage device.

While the exemplary embodiments of the present disclosure have been disclosed for illustrative purposes, those skilled in the art will appreciate that various modifications, additions and substitutions are possible. Therefore, the scope of the present disclosure must be defined by the accompanying claims and equivalents thereof rather than by the above-described embodiments.

Although the embodiments of the present disclosure have been disclosed, those skilled in the art will appreciate that various modifications, additions and substitutions are possible, without departing from the scope and spirit of the present disclosure.

In the above-discussed embodiments, all steps may be selectively performed or skipped. In addition, the steps in each embodiment may not always be performed in regular order. Furthermore, the embodiments disclosed in the present specification and the drawings aims to help those with ordinary knowledge in this art more clearly understand the present disclosure rather than aiming to limit the bounds of the present disclosure. In other words, one of ordinary skill in the art to which the present disclosure belongs will be able to easily understand that various modifications are possible based on the technical scope of the present disclosure.

Embodiments of the present disclosure have been described with reference to the accompanying drawings, and specific terms or words used in the description should be construed in accordance with the spirit of the present disclosure without limiting the subject matter thereof. It should be understood that many variations and modifications of the basic inventive concept described herein will still fall within the spirit and scope of the present disclosure as defined in the accompanying claims and equivalents thereof.

What is claimed is:

1. A storage device, comprising:
    a buffer memory configured to temporarily store data from a host;
    non-volatile memory chips; and
    a memory controller configured to receive a plurality of host requests, to count a number of random read requests among the plurality of host requests, to set a read workload status to a set state in response to the number of random read requests exceeding a reference count, and to control the buffer memory and the non-volatile memory chips to migrate the data from the buffer memory to the non-volatile memory chips based on the number of random read requests,
    wherein the memory controller includes:
    a logical to physical mapping table configured to store information of a logical address of data stored in a closed block and a corresponding physical address of the closed block; and
    a read processor configured to retrieve a physical address corresponding to a logical address of a currently provided read request by searching the logical to physical mapping table which stores the information when the read workload status is the set status.

2. The storage device of claim 1, wherein the memory controller flushes the data from the buffer memory to the non-volatile memory chips based on the read workload status.

3. The storage device of claim 1, wherein a length of a logical address provided along with the random read requests is less than a predetermined value.

4. The storage device of claim 2, wherein the memory controller sets the read workload status to a clear state in response to a sequential read request from the host.

5. The storage device of claim 4, wherein a length of a logical address provided along with the sequential read request exceeds a predetermined value.

6. The storage device of claim 1, wherein the memory controller comprises:
    a physical to logical mapping table configured to store information of a physical address of an open block and a corresponding logical address of data stored in the open block.

7. The storage device of claim 6, wherein the open block has an available data storage space that remains.

8. The storage device of claim 6, wherein the closed block has no remaining physical addresses to be allocated.

9. The storage device of claim 6, wherein the buffer memory stores a logical address corresponding to the data temporarily stored in the buffer memory.

10. The storage device of claim 6, wherein the read processor is further configured to retrieve the physical address corresponding to the logical address of the currently provided read request by searching in an order of the buffer memory, the physical to logical mapping table, and the logical to physical mapping table.

11. A memory controller comprising:
    a random read workload controller configured to control a state of a random read workload to a clear state in response to a sequential read request from an external host; and a read processor configured to retrieve a physical address corresponding to a logical address of a read request depending on the state of the random read workload.

12. The memory controller according to claim 11, wherein the random read workload controller comprises:
   a random read detector configured to determine whether a request inputted from the external host is a random read request;
   a random read counter configured to generate a random read count by counting a number of random read requests; and
   a random read workload setter configured to change the state of the random read workload to a set state from the clear state in response to the random read count exceeding a reference count.

13. The memory controller according to claim 12, wherein a length of a logical address provided along with the random read request is less than a predetermined value.

14. The memory controller according to claim 11, wherein a length of a logical address provided along with the sequential read request exceeds a predetermined value.

15. The memory controller according to claim 11, further comprising:
   a write cache buffer configured to temporarily store inputted data in response to a write request from the external host;
   a physical to logical mapping table configured to store information of a physical address of an open block and a corresponding logical address of data stored in the open block; and
   a logical to physical mapping table configured to store information of a logical address of data stored in a closed block and a corresponding physical address of the closed block.

16. The memory controller according to claim 15, wherein the open block has an available data storage space that remains.

17. The memory controller according to claim 15, wherein the closed block has no remaining physical addresses to be allocated.

* * * * *